United States Patent [19]

White

[11] Patent Number: 5,444,641

[45] Date of Patent: Aug. 22, 1995

[54] ADMITTANCE-PARAMETER ESTIMATOR FOR A PIEZOELECTRIC RESONATOR IN AN OSCILLATOR CIRCUIT

[75] Inventor: Stanley A. White, San Clemente, Calif.

[73] Assignee: Rockwell International Corporation, Seal Beach, Calif.

[21] Appl. No.: 125,890

[22] Filed: Sep. 24, 1993

[51] Int. Cl.$^6$ ............... G01R 23/16; G01R 27/00
[52] U.S. Cl. ............................ 364/484; 364/485; 364/495; 324/600; 324/727; 324/76.21; 324/603
[58] Field of Search ............... 364/484, 485, 495; 324/605, 667, 674, 681, 727, 76.12, 76.19, 76.21, 76.28, 76.29, 600, 603, 649; 73/488; 329/315, 304

[56] References Cited

U.S. PATENT DOCUMENTS

| Re. 32,931 | 5/1989 | Staudte | 73/505 |
|---|---|---|---|
| 3,682,003 | 9/1972 | Sage et al. | 73/503 |
| 3,974,699 | 9/1976 | Morris et al. | 73/432 |
| 4,096,142 | 5/1978 | Plunkett | 328/132 |
| 4,322,806 | 3/1982 | Allison | 364/485 |
| 4,654,663 | 3/1987 | Alsenz et al. | 340/870 |
| 4,713,782 | 12/1987 | Blackham | 364/553 |
| 4,782,281 | 11/1988 | Williamson | 324/57 |
| 4,868,494 | 9/1989 | Ryder et al. | 324/79 |
| 4,899,587 | 2/1990 | Staudte | 73/505 |
| 4,916,383 | 4/1990 | Sayers et al. | 324/605 |
| 5,056,366 | 10/1991 | Fersht et al. | 73/505 |
| 5,146,174 | 9/1992 | Toliver et al. | 324/727 |
| 5,185,585 | 2/1993 | Newell et al. | 331/46 |
| 5,193,391 | 3/1993 | Cage | 73/505 |

OTHER PUBLICATIONS

Franklin et al., *Feedback Control of Dynamic Systems*, 1986, pp. 284–287.
Chi-Tsong Chen, *One-Dimensional Digital Signal Processing*, Marcel Dekker, Inc., New York, N.Y. (1979), pp. 206–215.
Rabiner and Gold, *Theory and Application of Digital SIgnal Processing*, Prentice-Hall, Inc., Englewood Cliffs, N.J. (1975), pp. 136–140, 194–204.

Primary Examiner—Emanuel T. Voeltz
Assistant Examiner—Patrick J. Assouad
Attorney, Agent, or Firm—George A. Montanye; David J. Arthur; Tom Streeter

[57] ABSTRACT

Equivalent circuit parameters of a piezoelectric resonator are measured in order to precisely control the amplitude and/or frequency of oscillation of an oscillator including the resonator, or to compensate for variations in the amplitude and/or frequency of oscillation. Significant variations are caused by shunt capacitance, and to a lesser degree, series resistance. The equivalent circuit parameters are measured by exciting the resonator at a plurality of frequencies, measuring responses of the resonator at the frequencies, including a complex response at one of the frequencies, and determining a value of the shunt capacitance from the responses. Preferably, the resonator is simultaneously and continuously excited at three different frequencies, one of which is approximately the resonant frequency of the resonator. The complex responses are measured by complex demodulation, and the circuit parameters are computed from the responses by solving simultaneous equations resulting by setting each complex response equal to the admittance of the equivalent circuit at each different frequency. In this fashion, the equivalent circuit parameters are measured periodically during continuous operation of the oscillator for correction or compensation of the amplitude and/or frequency of oscillation.

5 Claims, 28 Drawing Sheets

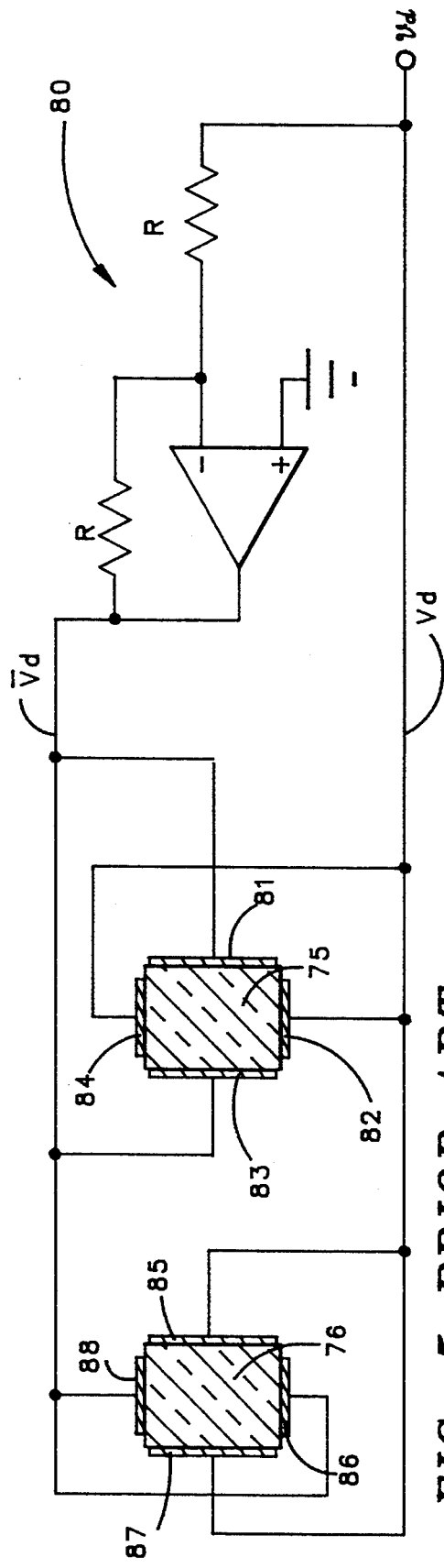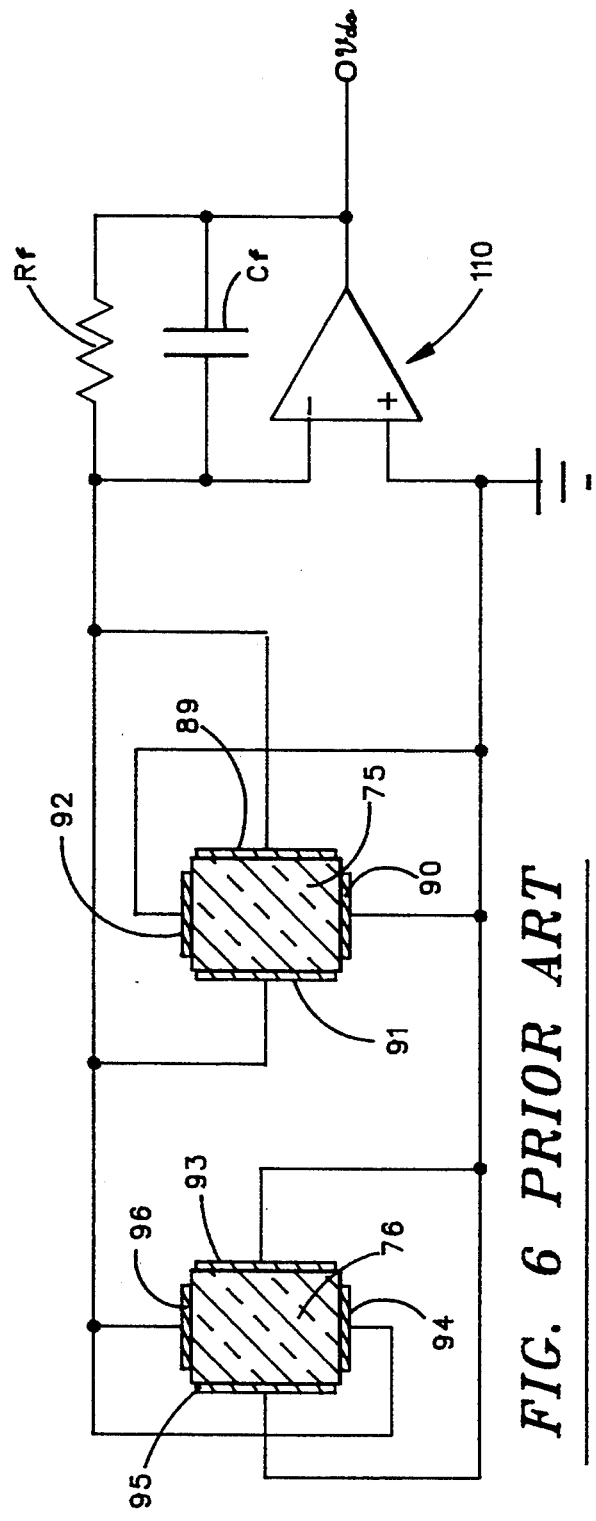
FIG. 5 PRIOR ART
FIG. 6 PRIOR ART

SET $\epsilon=0$ SO THAT $Re(\epsilon)=0$ and $Im(\epsilon)=0$

REALS: $Re(\epsilon) = A(1-\omega^2 LC) - B\omega RC + \omega^2 RCC_o = 0$

OR $A = A\omega^2 \widehat{LC} + B\omega \widehat{RC} - \omega^2 \widehat{RCC_o}$ SOLVE FOR $\widehat{LC}$, $\widehat{RC}$, $\widehat{RCC_o}$, AND EXTRACT $\widetilde{C_o}$.

IMAG: $Im(\epsilon) = A\omega \widehat{RC} + B - B\omega^2 \widehat{LC} - \omega \widetilde{C} - \omega \widehat{C_o} + \omega^3 \widehat{LC} \widetilde{C_o} = 0$ SOLVE FOR $\widetilde{C}$ AND EXTRACT $\widetilde{L} = \dfrac{\widehat{LC}}{\widetilde{C}}$ AND $\widetilde{R} = \dfrac{\widehat{RC}}{\widetilde{C}}$

- SOLUTION REQUIRES
- THREE KNOWN EXCITATION FREQUENCIES $(\omega_0, \omega_1, \omega_2)$
- AND THE SIX MEASUREMENTS
  $A(\omega_0), A(\omega_2), A(\omega_3), A(\omega_0), B(\omega_1), B(\omega_2),$

FIG. 18

ADMITTANCE-PARAMETER ESTIMATOR FOR A PIEZOELECTRIC RESONATOR IN AN OSCILLATOR CIRCUIT

BACKGROUND OF THE INVENTION

1. Field of the Invention

The present invention relates generally to digital signal processing, and more particularly to signal processing for a quartz angular-rate sensor or solid-state gyroscope.

2. Background Art

Angular-rate sensors are essential components of navigational and inertial guidance systems of aircraft, spacecraft, ships, and missiles. Traditionally, mechanical gyroscopes were used for angular rate sensing. More recently, laser ring gyros and vibrating quartz gyros have been developed that have characteristics superior to mechanical gyroscopes.

A particularly economical vibrating quartz gyro is made by acid etching of a quartz wafer and has two pairs of parallel tines in an "H" configuration. Such a quartz gyro is described, for example, in Fersht et al. U.S. Pat. No. 5,056,366 and Staudte U.S. Pat. No. Re 32,931. One pair of tines (the drive tines) is driven by an oscillator so that the tines move toward each other and away from each other. Rotational motion of the tines about the central longitudinal axis of the "H" causes the vibration of the drive tines to couple, by coriolis force, to the other pair of tines (the pick-off tines). The coriolis force causes the pick-up tines to vibrate in such a way that when one pick-off tine moves in one traverse direction perpendicular to the plane of the "H", the other pick-off tine moves in the opposite transverse direction perpendicular to the plane of the "H". The force, which drives the pick-off tines, is proportional to the cross-product of the angular rate of rotation $\Omega$ (e.g., radians per second), and the linear velocity of the drive tines (e.g., meters per second). Metal film pads are plated onto the tines for piezoelectric coupling to these vibrations of the tines. In the electrical pick-off signal, the angular rate of rotation of the quartz gyro about the longitudinal axis appears as double-sideband suppressed-carrier (DSSC) modulation of input angular rate; the carrier frequency is the frequency of oscillation of the drive tines. Therefore, an angular-rate signal can be recovered from the pick-off signal by a synchronous demodulator.

Analog circuits have been used for exciting the quartz gyro and for synchronous demodulation of the pick-off signal. Analog circuits, however, are subject to voltage offsets and drift of component values due to temperature variations and aging. These problems are particularly troublesome due to peculiarities of the quartz gyro that are not apparent from the simplified or "first order" operating characteristics as described above. One problem is related to the resonant frequencies of the drive tines and the pick-off tines. It is undesirable for the pick-off tines to have the same resonant frequency as the drive tines because of the extreme difficulty of removing the dynamics of the pick-off tines from the pick-off signal. If the pick-off tines did have the same resonant frequency as the drive tines, then a maximum amplitude response would be obtained from the pick-off tines, but the angular-rate signal would be a very non-linear function of the angular rate. The resonant frequency of the pick-off tines, however, must be tuned relatively closely to the resonant frequency of the drive tines, or else the dynamic range of the angular-rate signal is limited by noise. Therefore, some resonant frequency offset is required between the drive tines and the pick-off tines. This compromise in resonant frequency offset is to an extent dependent on the bandwidth of the angular-rate signal. In particular, the pick-off tines have a two-pole resonance characteristic, giving a second-order response ($\approx 1/(\omega^2 - \omega_o^2)$) far away from the resonant frequency ($\omega_o$). In practice, these considerations dictate that the difference between the resonant frequency of the drive tines and the resonant frequency of the pick-off tines should be about twice the bandwidth of the angular rate to be sensed by the quartz gyro. A typical quartz gyro for inertial navigation applications, for example, has a drive resonant frequency of about 10 kilohertz, a Q of about 18,000, and a difference of about 100 Hz between the drive resonant frequency and the pickoff resonant frequency. The pick-up tines, for example, have the higher resonant frequency. This difference in resonant frequencies causes the amplitude of the angular-rate signal to be dependent on the frequency as well as the amplitude of vibration of the drive tines. Moreover, the temperature dependence of the difference between the drive and pick-off resonant frequencies is the most critical temperature dependent parameter of the quartz gyro.

To obtain sufficient performance for inertial navigation, the analog circuits associated with the quartz gyro have been relatively complex and expensive. Moreover, it is estimated that the limitations of the prior-art analog circuitry causes the performance of the quartz gyro to be about an order of magnitude less than that theoretically possible and attainable by sufficiently complex digital signal processing.

SUMMARY OF THE INVENTION

A piezoelectric resonator such as a quartz crystal or quartz tuning fork can be fairly accurately modeled by an equivalent circuit including a series resistance R, a series inductance L, a series capacitance C, and a shunt capacitance $C_o$. Of these parameters, the series inductance L and series capacitance C define a frequency $\omega = 1/(LC)^{\frac{1}{2}}$ that is relatively fixed by the elasticity, mass density, and geometry of the piezoelectric material in the resonator. The shunt capacitance $C_o$, however, may have considerable variation because it includes capacitance due to fringing electric fields and parasitic capacitance between signal leads to the resonator. The series resistance R also may vary somewhat, because it represents damping of resonance, which may be affected by the mounting and physical connection of leads to the resonator.

By measuring the values of the parameters $C_o$ and/or R, it is possible to compensate for variation in the resonant frequency or amplitude caused by variations in these parameters. For example, to use the resonator as a frequency reference, the measured frequency of oscillation of the resonator in an oscillator circuit could be corrected as a function of the measured values of $C_o$ and/or R. Alternatively, other parameters of the oscillator circuit, such as the phase shift across the resonator, could be controlled in response to the measured values of $C_o$ and/or R, so that the oscillator circuit oscillates at the relatively constant frequency $\omega = 1/(LC)^{\frac{1}{2}}$.

For a quartz angular rate sensor having a drive fork and a pick-up fork, it is desirable to drive the drive fork at the frequency $\omega = 1/(LC)^{\frac{1}{2}}$, because this frequency will precisely track the resonant frequency of the pick-up fork when the effect of variations in the shunt capacitance of the electrodes on the pick-up fork are made negligible by connecting the pick-up electrodes to a charge amplifier or integrator having a relatively low input impedance. Moreover, the shunt capacitance $C_o$ and the series resistance R have an effect on the control of the amplitude of excitation of the drive fork by an automatic gain control in the driver circuit. The automatic gain control should be responsive to the amplitude of mechanical vibrations of the drive tines, and this amplitude corresponds to the current flowing through the series resistance, series inductance, and series capacitance in the circuit model of the drive fork. Therefore, it is desirable to measure the shunt capacitance $C_o$ and/or the series resistance R for adjustment of the reference level of the automatic gain control in order to compensate for variations in $C_o$ and R.

In accordance with a basic aspect of the invention, the shunt capacitance of a resonator is measured by: exciting the resonator at a plurality of frequencies; measuring responses of the resonator at the frequencies; and determining a value of the shunt capacitance from the responses at the frequencies; wherein at least one of the responses is a complex response. Preferably one of the frequencies is approximately a resonant frequency of the resonator, and the resonator is simultaneously and continuously excited by the plurality of frequencies. In this fashion, the circuit parameters are measured periodically during continuous operation of an oscillator having a frequency of oscillation of approximately the resonant frequency, so that these parameter measurements may be used for correction or compensation of the amplitude and/or frequency of oscillation.

In accordance with another aspect, the present invention provides a method of measuring circuit parameters of a resonator. The method includes the steps of: exciting the resonator at each of three distinct frequencies; measuring a complex response of the resonator to each of the three distinct frequencies; and computing values of the circuit parameters from the measured complex responses of the resonator to the three distinct frequencies. Preferably the circuit parameters include a shunt capacitance ($C_o$), a series resistance (R), a series inductance (L), and a series capacitance (C), and the circuit parameters are computed by solving simultaneously the following equations for the three distinct frequencies ($\omega_i$ for i=0, 1, and 2) and the complex responses $A_i+jB_i$:

$$A_i = A_i \omega_i^2 LC - B_i \omega_i RC - \omega_i RCC_o = 0$$

$$A_i \omega_i RC + B_i B_i \omega_i^2 LC - \omega_i C - \omega_i C_o + \omega_i C_o + \omega_i^3 L - CC_o = 0$$

In accordance with a final aspect, the invention provides an apparatus for measuring circuit parameters of a resonator. The apparatus includes: means for exciting the resonator at each of three distinct frequencies, the means for exciting including means for producing an in-phase reference signal and a quadrature-phase reference signal at each of the three distinct frequencies; a complex demodulator for each of the three distinct frequencies, each of the complex demodulators being coupled to the resonator and the means for exciting for demodulating a signal from the resonator with the in-phase reference signal and the quadrature-phase reference signal at the each of the three distinct frequencies to produce an in-phase demodulated signal and a quadrature-phase demodulated signal at the each of the three distinct frequencies; and means coupled to the complex demodulators for computing values of the circuit parameters from the in-phase demodulated signals and the quadrature-phase demodulated signals.

BRIEF DESCRIPTION OF THE DRAWINGS

Other objects and advantages of the present invention will become apparent upon reading the following detailed description and upon reference to the drawings, in which:

FIG. 5 is a cross-section of drive tines of the quartz angular-rate sensor of FIG. 4 along section line 5—5 in FIG. 4;

FIG. 6 is a cross-section of the drive tines of the quartz angular-rate sensor of FIG. 4 along section line 6—6 if FIG. 4;

FIG. 18 is an illustration of a procedure for solving the admittance equations of FIG. 16 for the components values in accordance with the circuit model of FIG. 17;

While the invention will be described in connection with certain preferred embodiments, it is not intended that the invention should be limited to these particular embodiments. On the contrary, the invention is intended to include all modifications, alternatives, and equivalent arrangements as may be included within the scope of this invention as defined by the appended claims.

DETAILED DESCRIPTION OF THE PREFERRED EMBODIMENTS

Figure 1:
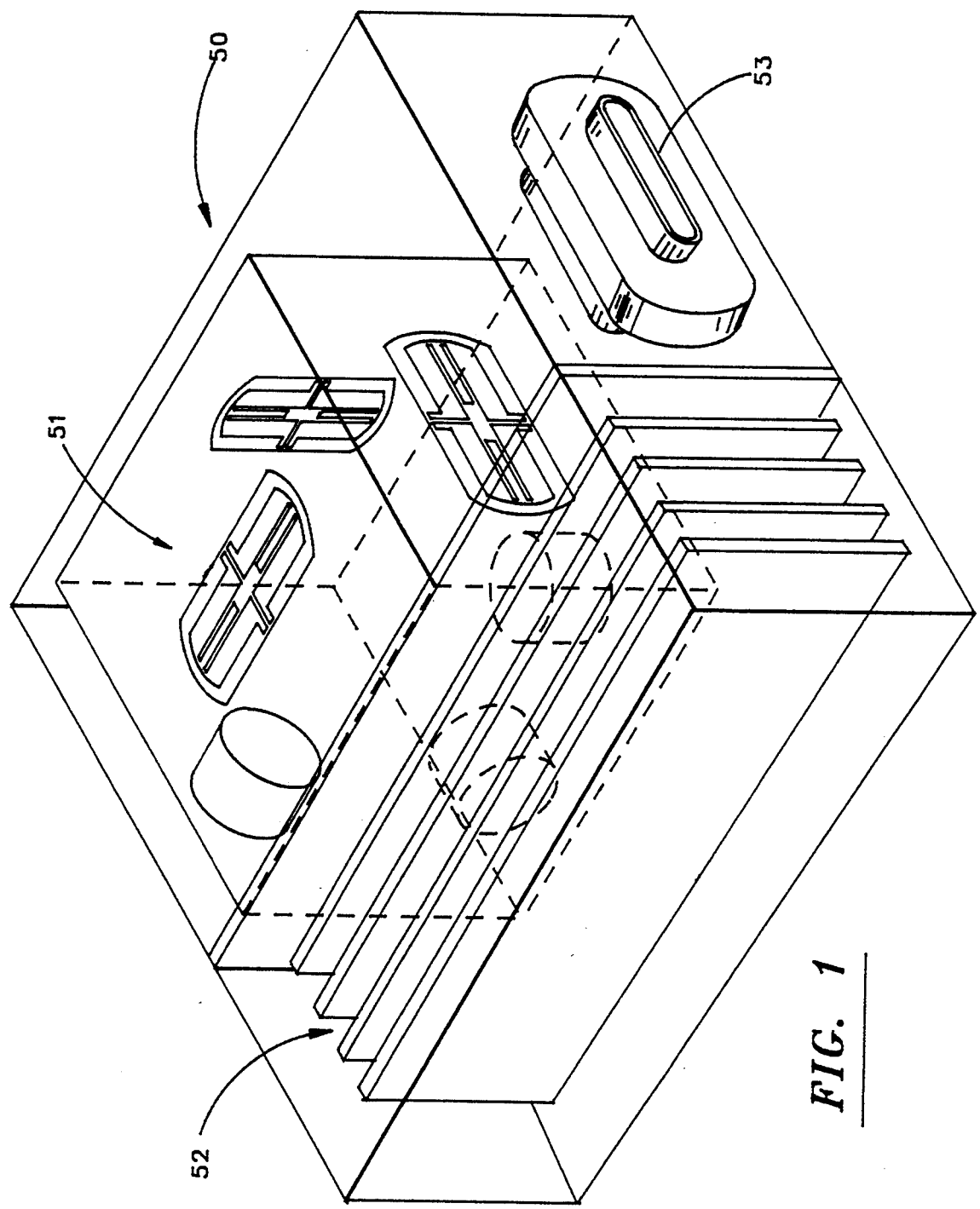
FIG. 1 is a perspective view of an inertial measurement unit incorporating present invention.

Turning now to the drawings, there is shown in FIG. 1 a schematic perspective view of an inertial measurement unit generally designated 50 incorporating the present invention. The inertial measurement unit includes a block of sensors 51, electronic circuit boards 52, and an electrical connector 53. The inertial measurement unit 50 provides an angular velocity signal and a linear acceleration signal with respect to each of three orthogonal directions. The angular velocity and linear acceleration signals have a 50 Hz bandwidth.

Figure 2:
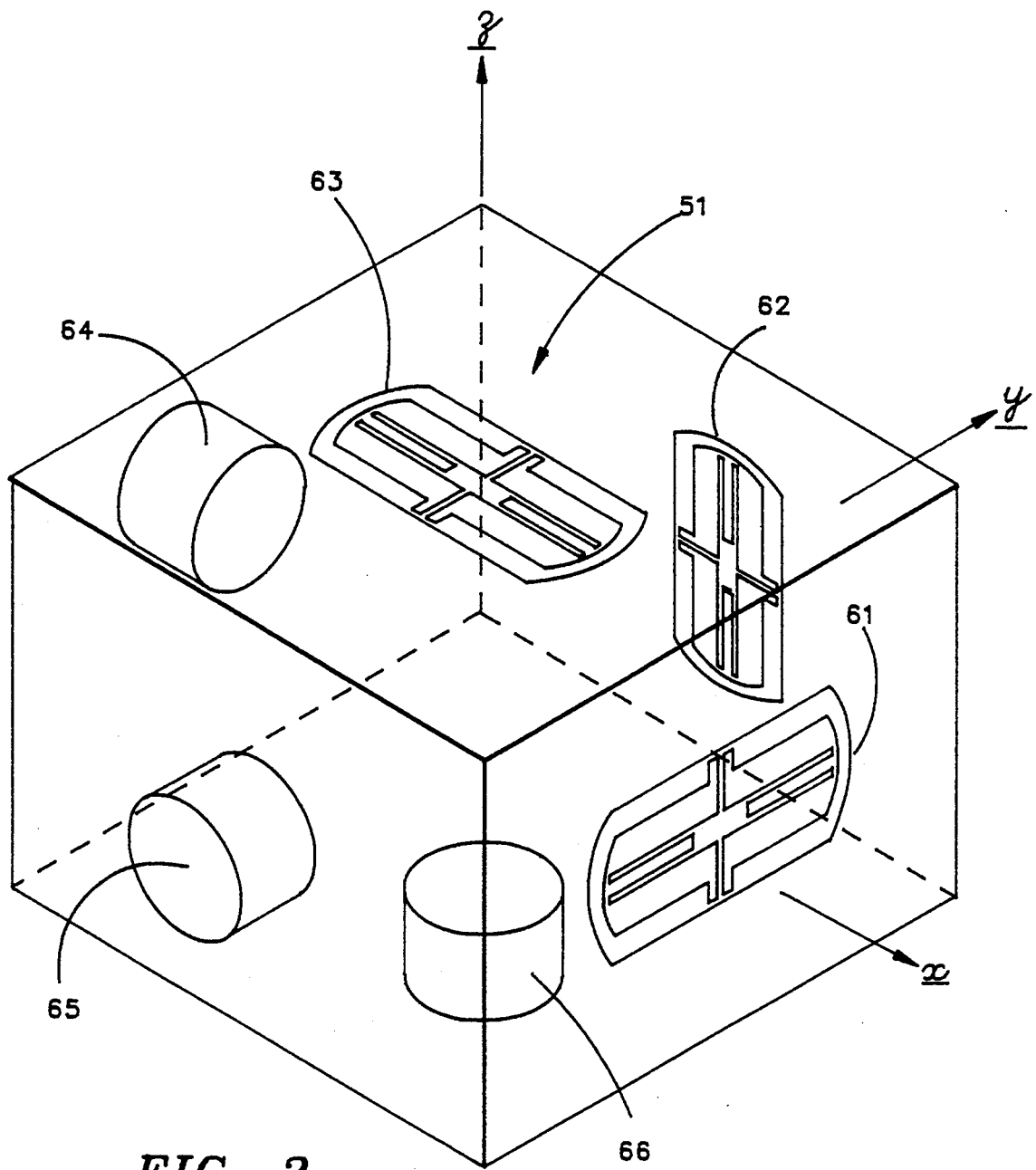
FIG. 2 is a pictorial view of a mounting arrangement for accelerometers and quartz angular-rate sensors used in the inertial measurement unit of FIG. 1.

Turning now to FIG. 2, there is shown a pictorial view of the sensor block 51. The block is made of a rigid material such as aluminum or polycarbonate. A quartz angular-rate sensor or a vibrating quartz accelerometer is mounted into each of the six faces of the block 51. The sensors include quartz angular-rate sensors 61, 62, and 63 mounted on the faces facing the +x, +y, and +z directions. The sensors include vibrating quartz accelerometers 64, 65, and 66 mounted on the faces facing the −x, −y, and −z directions, respectively.

The present invention concerns signal processing for the quartz angular-rate sensors 61, 62, and 63. The quartz angular-rate sensors operate entirely independent of the vibrating quartz accelerometers. Therefore, the vibrating quartz accelerometers 64, 65, 66 are not pertinent to the present invention and will not be described in any further detail.

Figure 3:
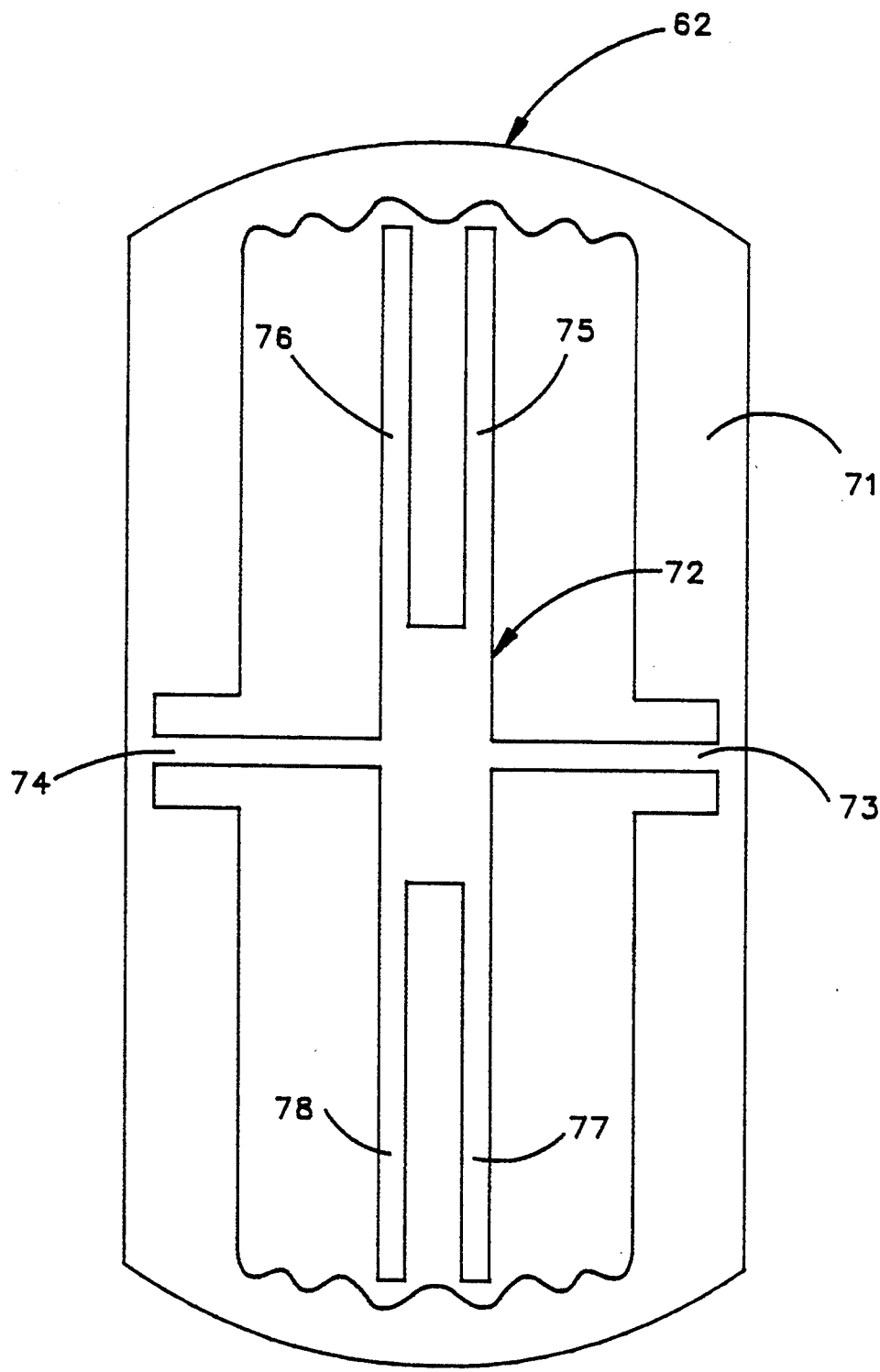
FIG. 3 is a plan view of one of the quartz angular-rate sensors of FIG. 2.

Turning now to FIG. 3, there is shown a more detailed view of the quartz angular-rate sensor 62. The sensor 62 is fabricated from a z-cut quartz wafer using conventional photolithographic and acid etch batch processes, and can be purchased from Systron Donner Corporation of Concord, Calif. The sensor has a frame 71 attached to an "H"-shaped section by a pair of bridges 73, 74. The "H"-shaped section 72 has a pair of drive tines 75, 76, and a pair of pick-up tines 77, 78.

Figure 4:
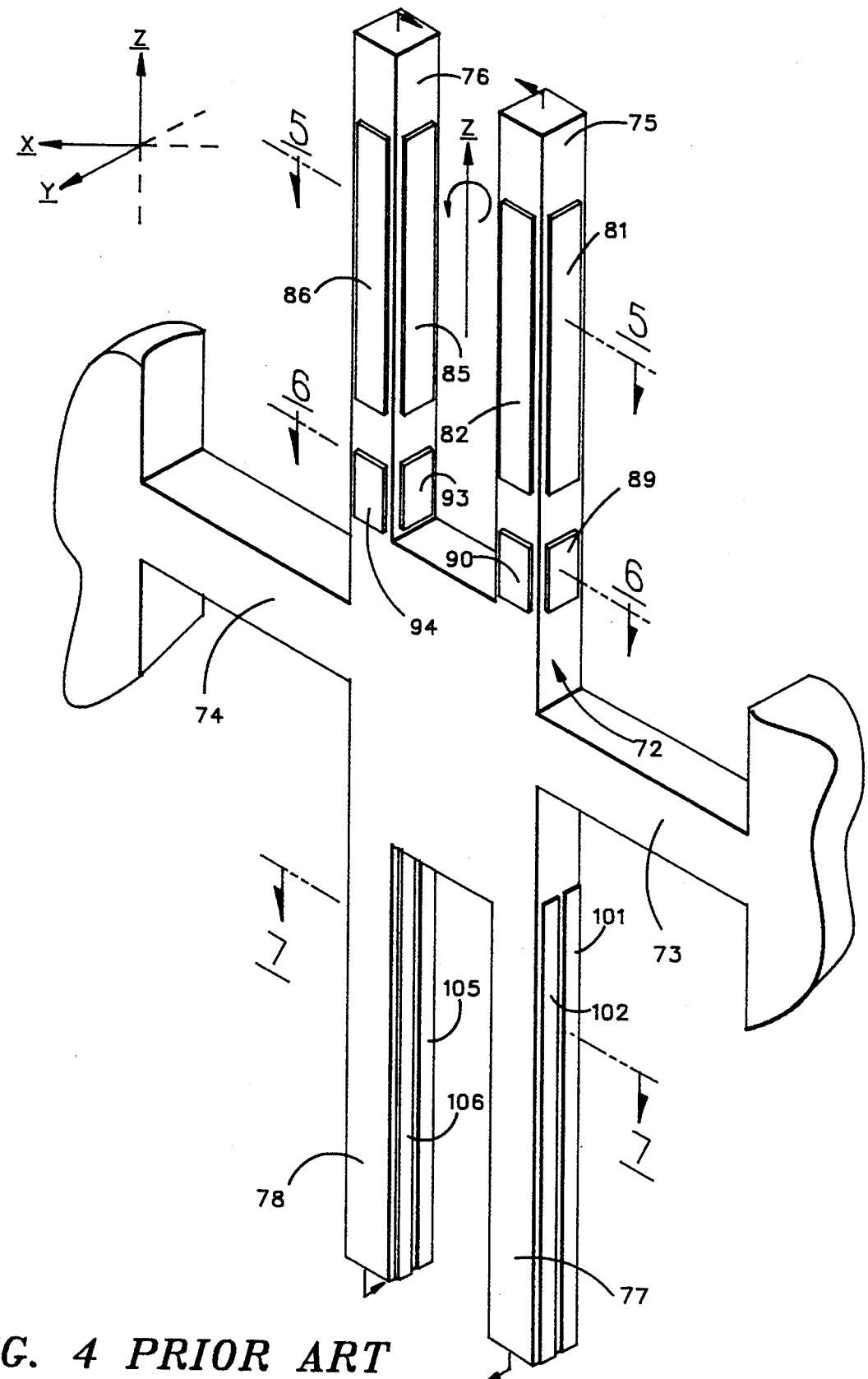
FIG. 4 is a perspective view of a central portion of the quartz angular rate sensor of FIG. 3.

Turning now to FIG. 4, there is shown a number of metal film electrodes deposited on the tines 75, 76, 77, and 78. The drive tines 75, 76 are provided with drive electrodes 81, 82, 83, 84, 85, 86, 87, 88, as further shown in FIG. 5. The drive electrodes are driven by a complementary drive signal $V_d$, as shown in FIG. 5, to excite a mode of vibration in the drive tines 75, 76 in which the drive tines first move toward each other in the x direction, as shown in FIG. 4, and then away from each other, during each cycle of vibration. To sustain such a mode of vibration, the complementary drive signal $V_d$ must be tuned to the resonant frequency of the drive tines. As shown in FIG. 5, a unity-gain inverting amplifier 80 is used in providing the complementary drive signal from a single-ended drive signal.

To drive the drive tines 75, 76 at their resonant frequency, the drive tines are excited in response to sensing their elastic deformation. For this purpose, a second set of metal film electrodes 89 to 96, as further shown in FIG. 6, are disposed on the drive tines 75, 76 at locations of maximum elastic deformation where the tines are joined to the central portion of the H-shaped structure 72, as shown in FIG. 4. These electrodes 89 to 96 are connected to a conventional amplifier 110 providing a signal $v_{do}$ indicating the elastic deformation of the drive tines 75, 76.

As shown in FIG. 4, the vibration of the pick-up tines 77, 78 is sensed by metal film electrodes 101 to 108 deposited on the pick-up tines. As further shown in FIG. 7, the pick-up electrodes 101 to 108 are connected to a conventional amplifier 111 to provide a signal $v_r$ indicating the vibration of the pick-up tines.

Figure 7:
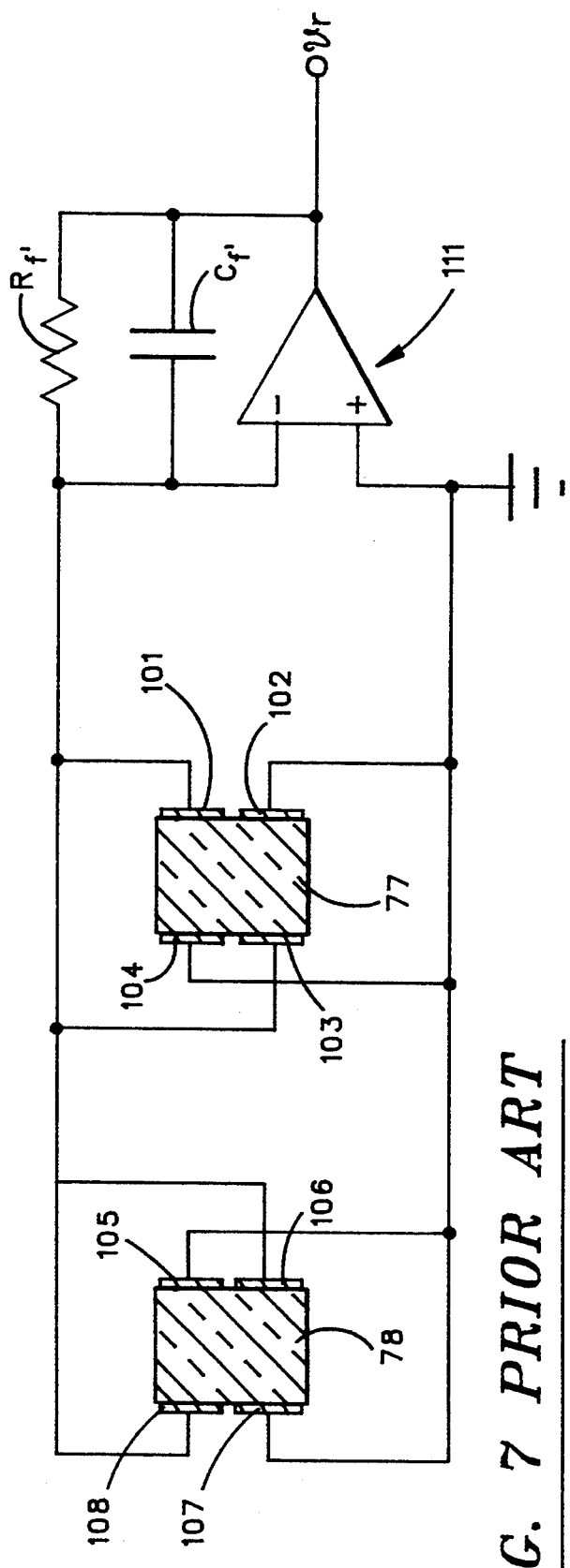
FIG. 7 is a cross-section of pick-up tines of the quartz angular-rate sensor or of FIG. 4 along section line 7—7 in FIG. 4.
Figure 8:
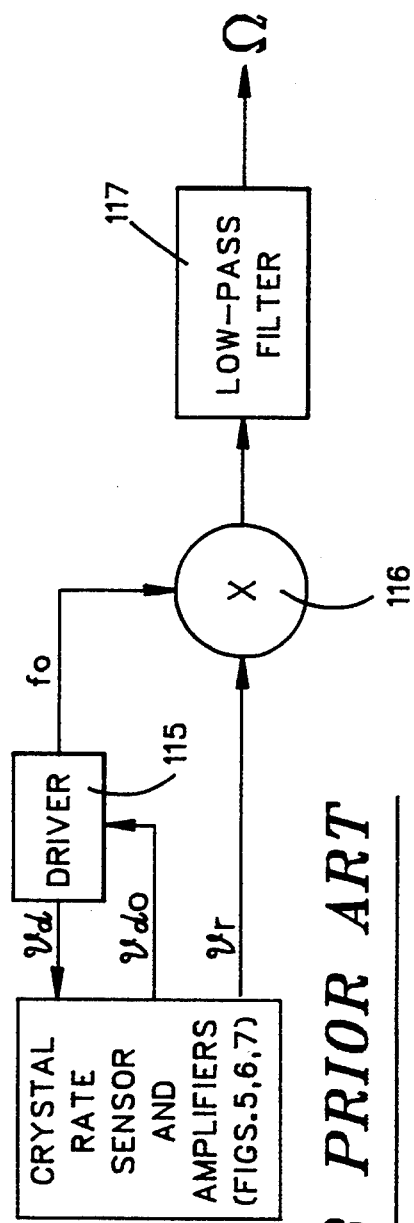
FIG. 8 is a block diagram of a conventional system for exciting the quartz angular-rate sensor of FIG. 4 and synchronously detecting an angular-rate signal.

Turning now to FIG. 8, there is shown a conventional circuit for obtaining an angular-rate signal $\Omega$ from the quartz angular-rate sensor and amplifiers as shown in FIGS. 5, 6, and 7. A driver circuit 115 is responsive to the signal $v_{do}$ to produce a drive signal $v_d$ at the resonant frequency of oscillation of the drive tines (75, 76 in FIG. 4). Moreover, the driver circuit 115 insures that the amplitude of vibration of the drive tines 75, 76 is substantially constant. Further, the driver 115 supplies a signal at the frequency of oscillation fo to a synchronous detector 116, such as a balanced modulator, that modulates the pick-up signal $v_r$ to detect the angular-rate information. A low-pass filter 117 extracts the angular-rate signal $\Omega$ from the output of the synchronous detector 116.

Figure 9:
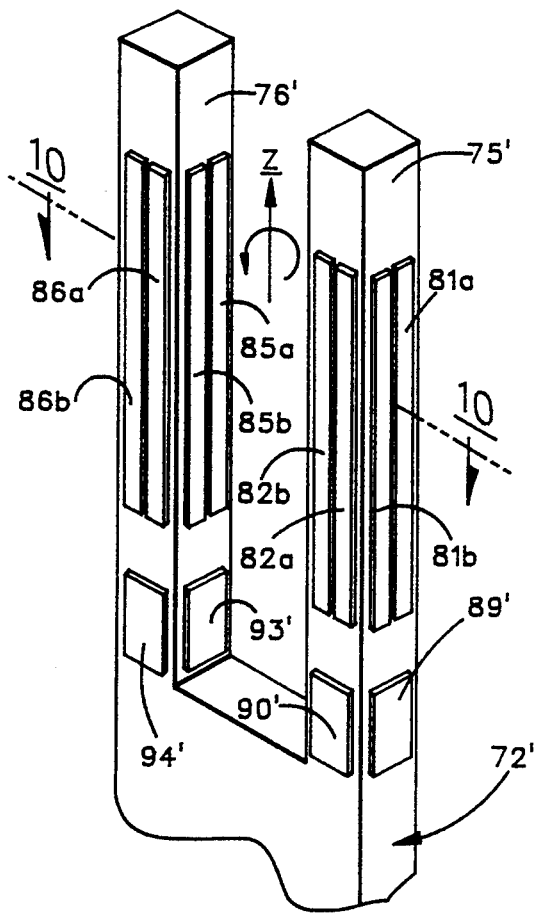
FIG. 9 is a perspective view showing an alternative construction for electrodes on drive tines of a quartz angular-rate sensor.
Figure 10:
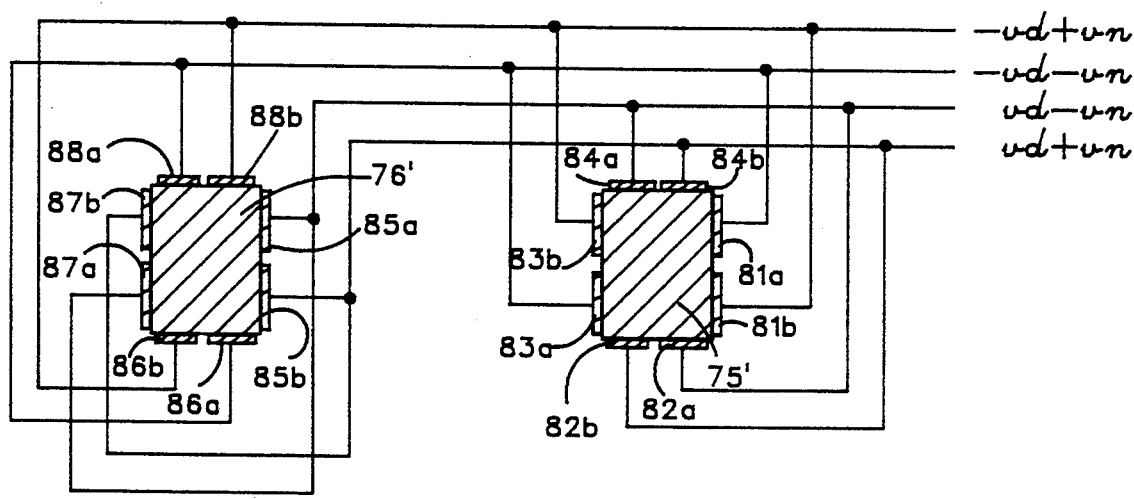
FIG. 10 is a cross-section of "the drive tines of the quartz angular-rate sensor of FIG. 9 along section line 10—10 of FIG. 9.

Turning now to FIG. 9, there is shown an alternative construction in which pairs of drive electrodes 81a, 81b, to 88a, 88b, are deposited on the drive tines 75', 76', as further shown in FIG. 10. In this alternative construction, the drive electrodes 81a, 81b, to 88a, 88b are excited with a nulling signal $v_n$ in addition to the drive signal $v_d$. The nulling signal $v_n$ excites vibrations of the drive tines 75', 76' that directly couple to the pick-up tines (not shown), and therefore the nulling signal can be adjusted to minimize or null the vibration of the pick-up tines 77, 78.

Figure 11:
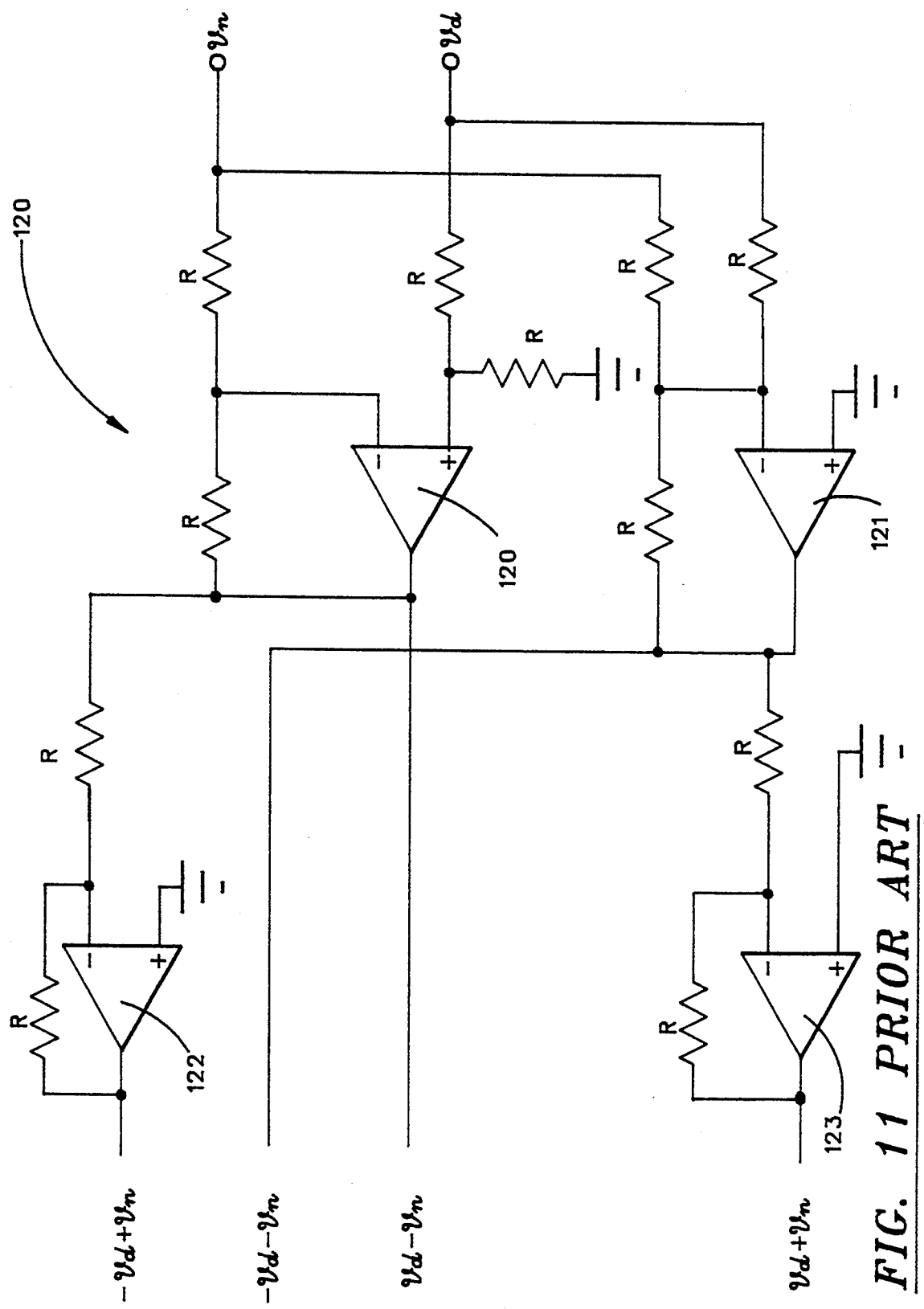
FIG. 11 is a schematic diagram of analog computational circuits for computing drive signals for the drive electrodes as shown in FIG. 10.

As shown in FIG. 11, analog computational circuits 120 receive a single-ended drive signal $v_d$ and a single-ended null signal $v_n$ to produce electrical signals $(-v_d+v_n, -v_d-v_n, v_d-v_n, -v_d-v_n)$ that are applied to the pairs of drive electrodes (81a, 81b, to 88a, 88b in FIG.. 10). These analog computational circuits 120 include an operational amplifier 120 wired as a differential amplifier, an operational amplifier 121 wired as an inverting summing amplifier, an operational amplifier 122 wired as an inverting unity gain amplifier, and an operational amplifier 123 wired as an inverting unity gain amplifier.

Figure 12:
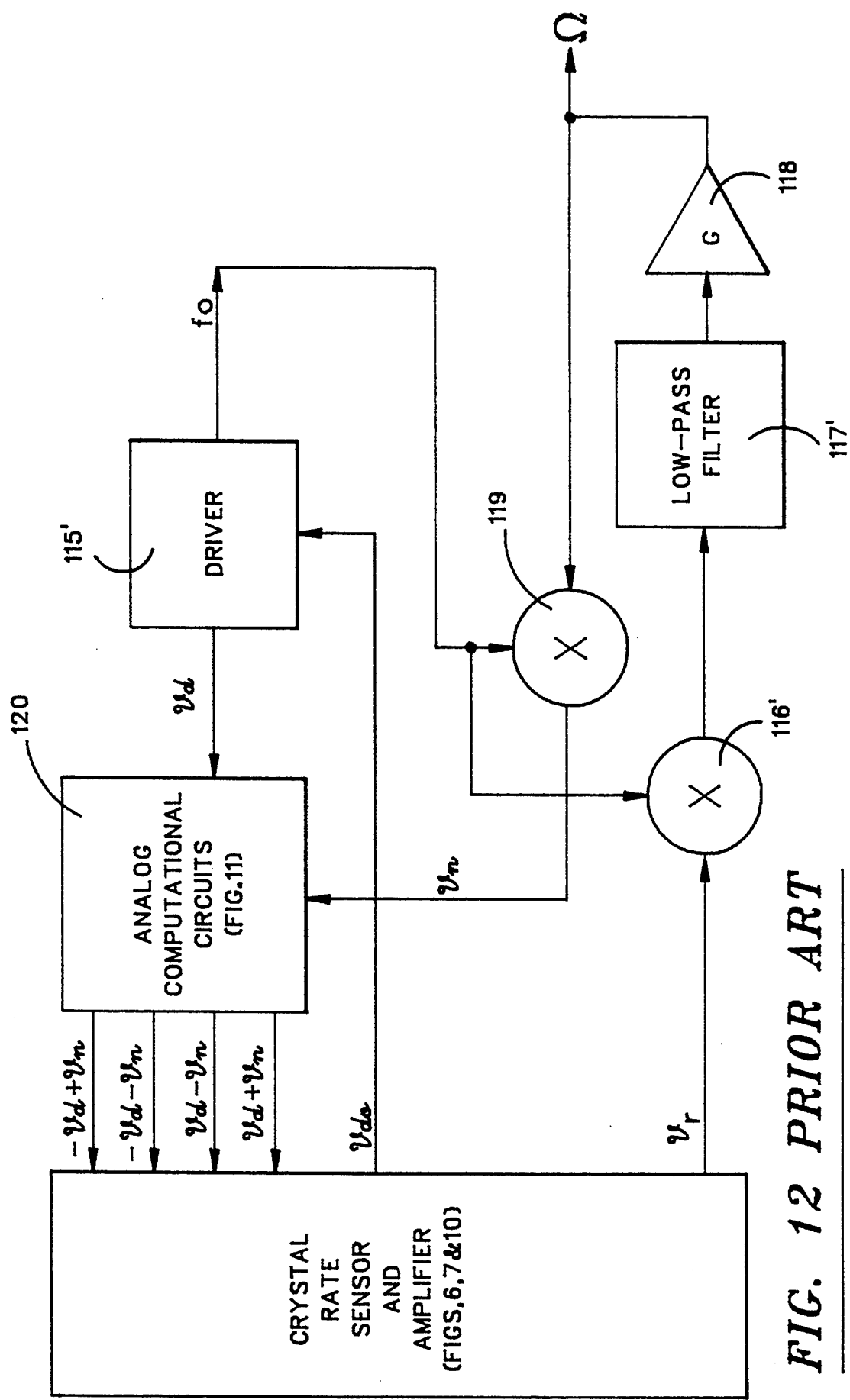
FIG. 12 is a conventional circuit for exciting the quartz angular rate sensor of FIG. 9 and synchronously detecting an angular-rate signal.

When the quartz angular-rate sensor is operated such that a null signal $v_n$ nulls out the pick-up signal $v_r$, the quartz rate sensor is said to be operated in a "closed loop" mode. A circuit for operating the quartz rate sensor in such a "closed-loop" mode is shown in FIG. 12. The circuit includes a driver 115', a synchronous detector 116', and a low-pass filter 117' that are similar to the driver 115, synchronous detector 116, and low-pass filter 117 introduced in FIG. 8. However, the circuit in FIG. 12 further includes a baseband servo equalizer and feedback amplifier 118, a balanced modulator 119 for supplying the null signal $v_n$ at the frequency of oscillation $f_o$ but having an amplitude controlled by negative feedback to null out the pick-up signal $v_r$, and the analog computational circuits 120 shown in FIG. 11. Therefore, the amplifier 118 provides the angular-rate signal $\Omega$.

Figure 13:
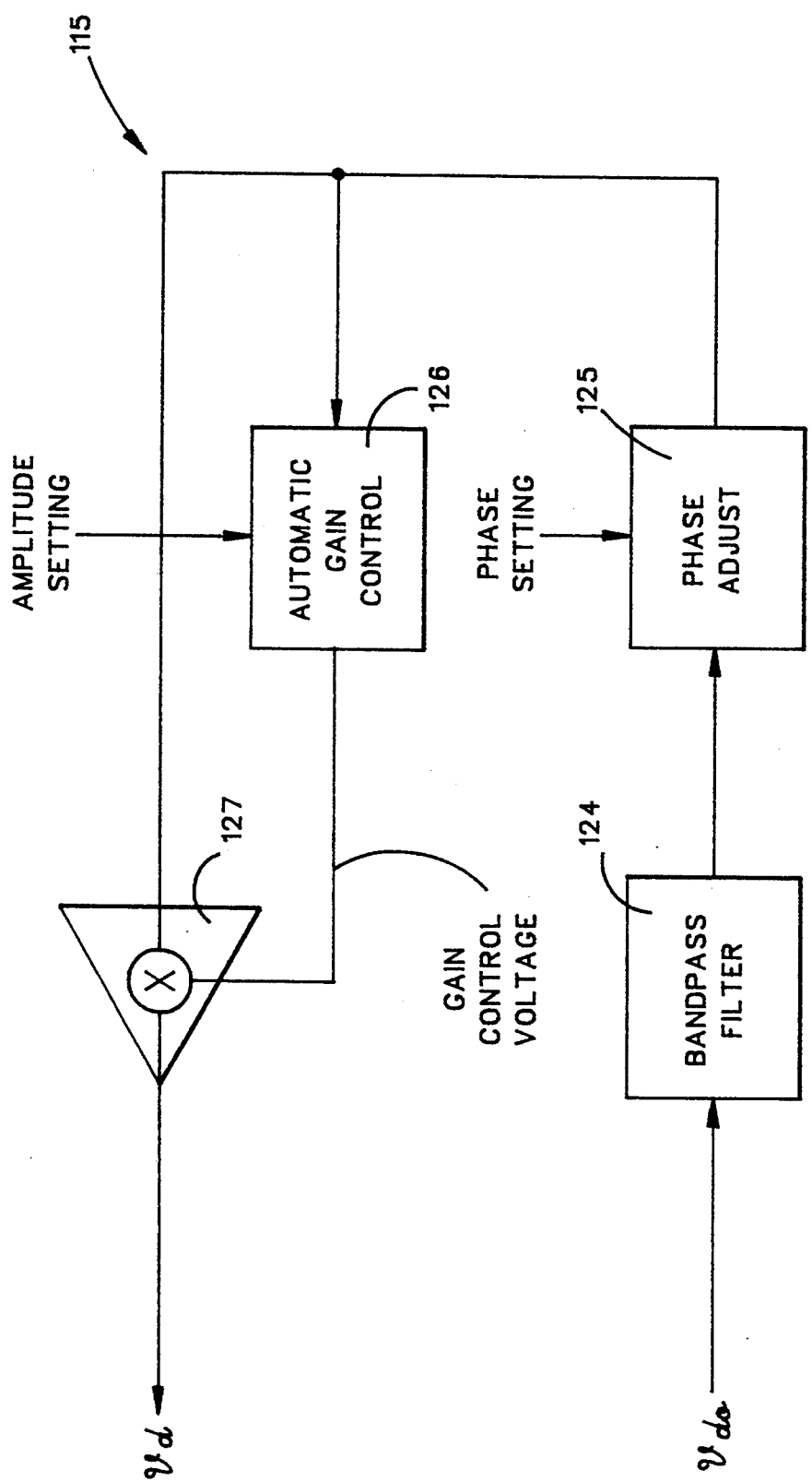
FIG. 13 is a block diagram of an analog drive circuit used in FIG. 12 for exciting the quartz angular-rate sensor.

Turning now to FIG. 13, there is shown a block diagram for the driver circuit 115 of FIG. 8. The driver circuit 115 includes a bandpass filter 124 that filters the $v_{do}$ signal and is tuned for a maximum response at the resonant frequency fo of the drive tines. The output of the bandpass filter 124 is fed through a phase-adjusting circuit 125 that is adjusted for (360)(n) degree (n is any integer) phase shift around the entire drive loop, through the drive electrodes (81 to 88 in FIGS. 4 and 5), through the physics of the drive fork, through the drive sensing electrodes (89 to 96 in FIGS. 4. and 6), and through the electronics in FIG. 13. The output of the phase-adjusting circuit is fed to an automatic gain control 126 that senses the amplitude of the signal from the phase-adjusting circuit and generates a gain control voltage responsive to the difference between the amplitude of the signal from the phase-adjusting circuit 125 and an amplitude setting. The amplitude setting may be adjusted, for example, in response to calibrating the angular-rate sensor by subjecting the sensor to a precise rate of angular rotation and adjusting the amplitude setting so that the angular-rate signal $\Omega$ precisely indicates the rate of angular rotation. The gain-control voltage from the automatic gain control adjusts the gain of a linear amplifier 127 that amplifies the output of the phase-adjusting circuit 125 to produce the drive signal $v_d$. The linear amplifier, for example, is an operational transconductance amplifier, such as RCA part No. CA3080.

Figure 14:
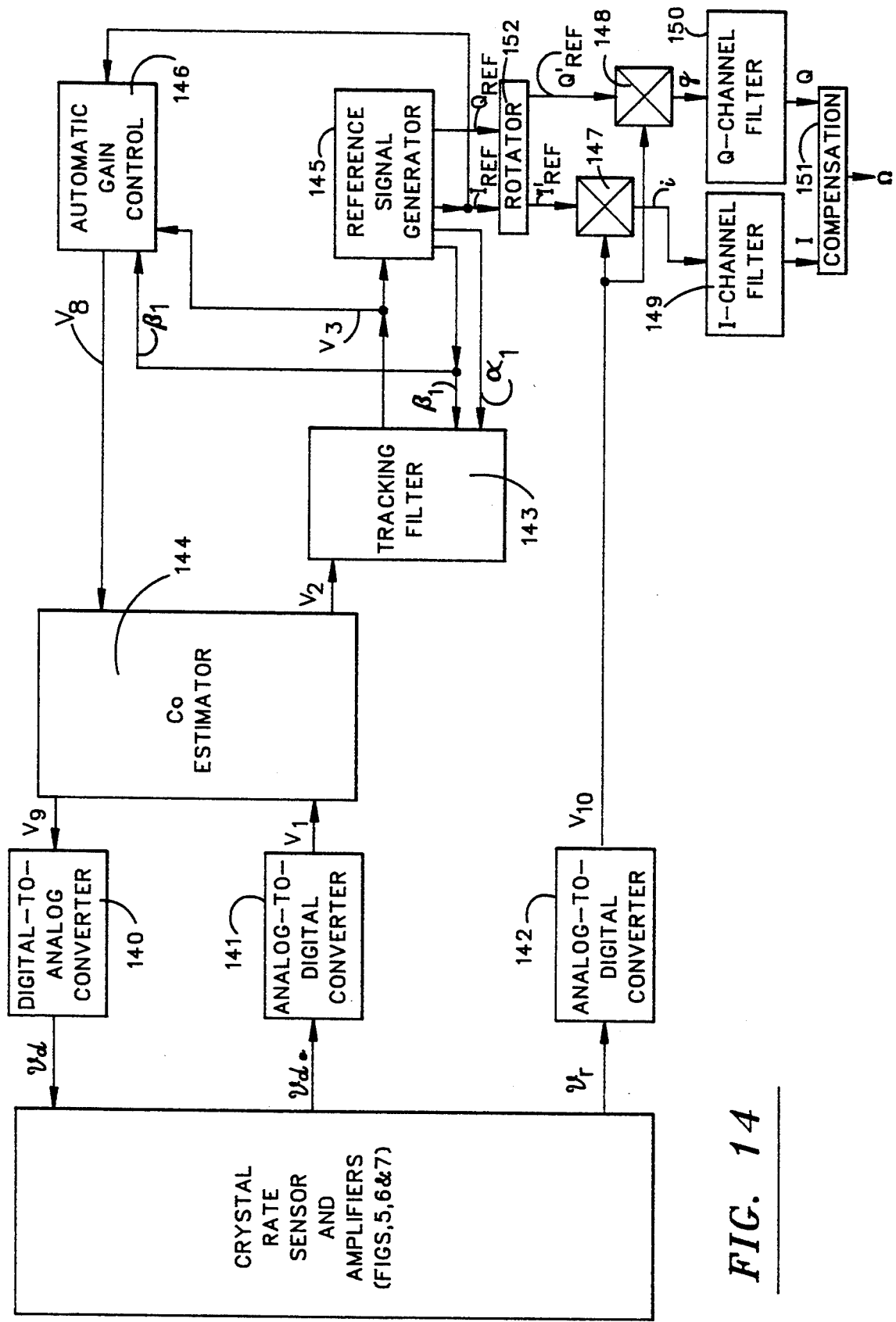
FIG. 14 is a block diagram of an angular rate sensor using digital signal processing in accordance with the present invention.

Turning now to FIG. 14, there is shown a block diagram of a quartz rate sensor system using digital signal processing in accordance with the present invention. The drive signal $v_d$ to the quartz rate sensor is produced by a digital-to-analog converter 140 in response to a digital value $v_9$. The digital-to-analog converter 140, for example, is a 16-bit monolithic voltage output D/A converter such as Analog Devices part no. AD569, or an Analog Devices 18-bit digital-to-analog converter part no. AD1139. The output voltage $v_{do}$ indicating the level of excitation of the quartz rate sensor is sampled by an analog-to-digital converter 141 to produce a digital signal $v_l$. In a similar fashion, the pick-off signal $v_r$ is sampled by an analog-to-digital converter 142 to produce a digital signal $v_{10}$. The analog-to-digital converter 141 and the analog-to-digital converter 142, for example, are 16-bit 100k SPS sampling analog-to-digital converters, such as the Analog Devices part no. AD676, which uses a switched-capacitor/charge redistribution architecture. The digital-to-analog converter 140, the analog-to-digital converter 141, and the analog-to-digital converter 142 are all clocked in synchronism with a fixed sampling rate, which is, for example, 42 kHz. For the inertial measurement unit as shown in FIG. 1, the circuit as shown in FIG. 14 is replicated three times, and all of the digital-to-analog converters and analog-to-digital converters are clocked in synchronism with a common system clock (not shown) which is external to the inertial measurement unit 50. The system clock, for example, is part of an avionics package that receives the angular rate and linear acceleration information from the inertial measurement unit 50.

Aside from the quartz rate sensor and amplifiers, and the digital-to-analog converter 140 and the analog-to-digital converters 141, 142 in FIG. 14, all of the other components are synchronous digital logic circuits which could be implemented as either a programmed data processor or as hard-wired logic, for example, in an application-specific integrated circuit. The synchronous digital circuits, for example, could be implemented in a Star Semiconductor SPROC programmable digital signal processing (DSP) integrated circuit which is designed for fixed-point 24-bit arithmetic.

In order to excite the quartz rate sensor at the resonant frequency of the drive tines (75 and 76 in FIG. 4), the digital circuitry in FIG. 14 includes a $C_o$ estimator 144 for estimating shunt capacitance $C_o$ of the drive tines, a tracking filter 143 that tracks the resonant frequency of the drive tines, a reference signal generator 145, and an automatic gain control 146.

The $C_o$ estimator 143 measures the shunt capacitance $C_o$ and other parameters in a circuit model for the drive tines of the quartz rate sensor. The measured value of the shunt capacitance $C_o$ is used to cancel or compensate for effects of variation of the shunt capacitance. Without cancellation or compensation, for example, an increase in the shunt capacitance would cause a decrease in the amplitude of excitation of the quartz rate sensor, and a decrease in frequency of excitation of the quartz rate sensor. The decrease in amplitude of the excitation would directly decrease the amplitude of the detected angular rate signal $\Omega$. The decrease in frequency of excitation of the quartz rate sensor would further decrease the amplitude of the detected angular rate signal, for example, in the typical case where the pick-up tines are constructed to have a higher resonant frequency than the drive tines.

The signal $v_{do}$ includes a noise-contaminated demodulation reference signal that is slowly drifting in frequency. The tracking filter 143 automatically adjusts its passband width and passband center frequency in order to extract the demodulation reference signal. Therefore, the output $v_3$ of the tracking filter 143 is a very clean sinusoid.

The reference signal generator 145 provides two reference signals $I_{REF}$ and $Q_{REF}$ which are exactly 90° apart in phase. A rotator 152 performs a complex rotation upon the reference signals $I_{REF}$ and $Q_{REF}$ to produce adjusted reference signals $I'_{REF}$ and $Q'_{REF}$, which are used to demodulate the angular rate signal $\Omega$ from the pick-off signal $v_r$. The reference signal generator 145 also provides exactly an integral number n times 360° of phase shift around the drive loop. Therefore the drive tines of the quartz rate sensor are driven at their resonant frequency, which occurs when there is zero phase shift through the drive tines.

The automatic gain control 146 provides exactly unity gain around the drive loop by exciting the drive tines so that the reference frequency signal extracted by the tracking filter 143 has a constant amplitude.

In order to demodulate the angular rate signal $\Omega$ from the pick-off signal $v_r$, a first multiplier 147 multiplies the signal $v_{10}$ from the analog-to-digital converter 142 by the in-phase reference signal $I'_{REF}$ to produce an in-phase product value (i), and a second multiplier 148 multiplies the signal $v_{10}$ by the quadrature-phase signal $Q'_{REF}$ to produce a quadrature-phase product value (q). The in-phase value (i) is received in an I-channel filter 149, which is a conventional decimating digital low-pass filter, to provide a filtered value I at a lower rate such as 600 Hz. In a similar fashion, the quadrature-phase value (q) is received in a Q-channel filter 150, which also is a conventional digital low-pass decimating filter, to provide a filtered value Q at a lower rate such as 600 Hz.

Because the circuit of FIG. 14 provides both in-phase and quadrature-phase detected signals, any phase shift or tuning error between the reference signal $I'_{REF}$ and the suppressed carrier in the pick-off signal $v_r$ can be corrected by a rotation of the complex vector $I+iQ$, and this rotation can be performed by the rotator 152. For example, all of the detected angular-rate signal should appear in the in-phase channel I of FIG. 14. In practice, however, there will be some phase offset causing some of the angular-rate signal to appear in the quadrature-phase channel Q.

In general, the angular-rate signal $\Omega$ should have a sign that is the sign of the signal in the in-phase channel I and a corrected magnitude equal to the square root of $I^2+Q^2$. In fact, imperfections within the instrument, alignment errors, and capacitive coupling cause extraneous contributions to the I and Q signals which should be eliminated by calibration and post-processing by computing $\Omega$ from the signals I and Q after removal of the extraneous contributions. Compensation 151 for the extraneous contributions could be performed by referencing calibration data retrieved from calibration tables programmed in non-volatile memory.

Figure 15:
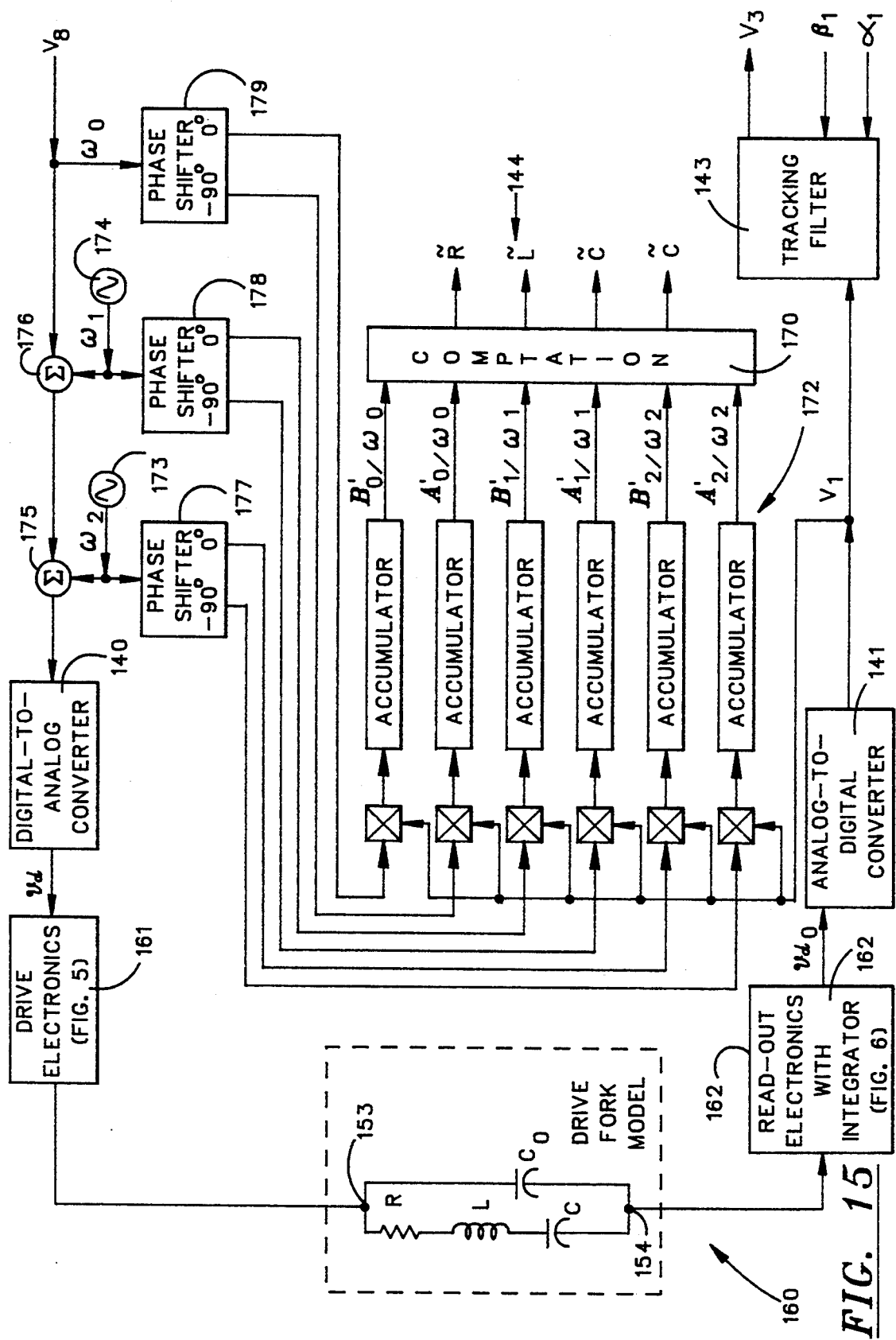
FIG. 15 is a more detailed block diagram of a shunt capacitance estimator and a tracking filter introduced in FIG. 14.

Turning now to FIG. 15, there are shown the components of the $C_o$ estimator 144 and the tracking filter 143. The drive fork is shown as a circuit model 160 including a shunt capacitance $C_o$, a series resistance R, a series inductance L, and a series capacitance C connecting the drive electronics 161 to the readout electronics 162. The read-out electronics 162 includes the integrator shown in FIG. 6, which presents a low impedance to the drive fork model and integrates current from the drive fork model. The drive electronics 161 places a voltage across the drive fork model. Consequently, the transfer characteristic of the drive fork model is the admittance of the drive fork model between its input node 153 and its output node 154. The effect of $C_o$ should be compensated for so that the fork is driven at an angular frequency of $(LC)^{-\frac{1}{2}}$. The fork must be driven at resonance to obtain the gain necessary to impress a sufficiently large drive force (proportional to $\Omega xv$) on the pickoff tines. The radial velocity of the drive tines is v; the gain is quite sensitive to a small drive-frequency error.

There is an additional frequency dependence of the angular rate signal $\Omega$ gain as a function of the difference between the resonant frequency of the drive fork and the resonant frequency of the pick-up fork. The values of L and C, for example, are determined primarily by the mass and elasticity of quartz, and the geometry of the resonator. Assuming then that the drive fork is driven at the "invariant" frequency of $\omega=1/(LC)$, then the admittance or transfer function of the drive fork is simply $Y(s)=(RC_o s+1)/R$ and the phase angle across the drive fork is $\arctan(RC_o 107) \approx RC_o \omega$. Therefore frequency shifts cause by extraneous variations in $C_o$ and also R can be compensated for by measuring $C_o$ and measuring R and adjusting the phase shift in the drive loop, as further described below, for a phase shift of $\arctan(RC_o \omega) \approx RC_o \omega$ across the drive tines.

Figure 16:
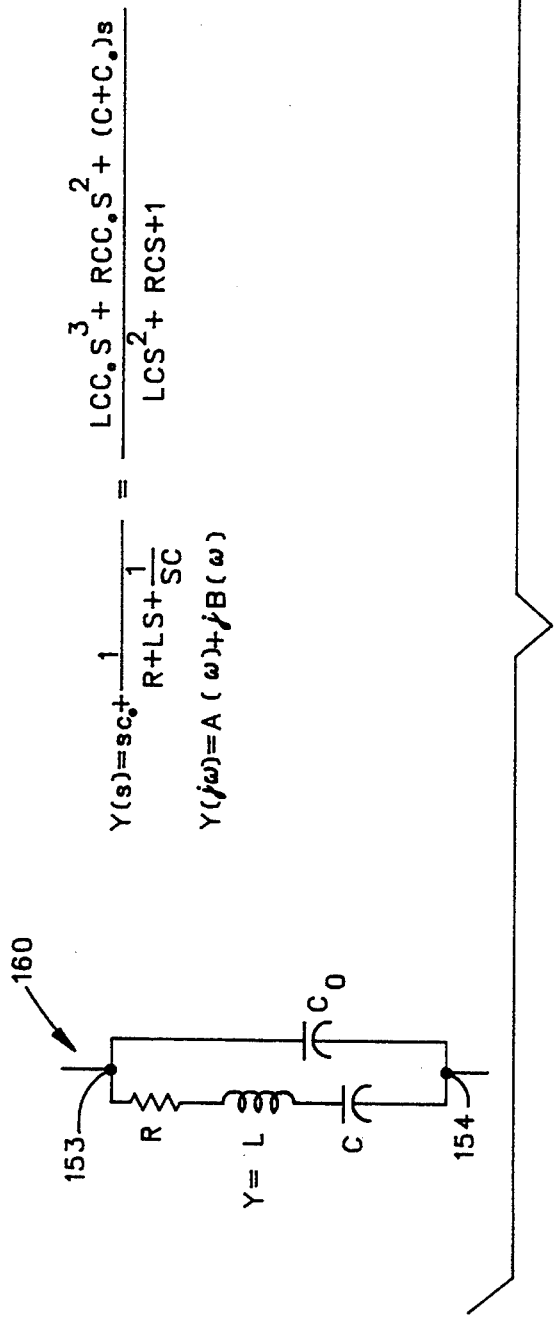
FIG. 16 is a circuit model for the drive tines of the angular rate sensor in the system of FIG. 14, and further shows mathematical equations defining the admittance of the drive tines.

Turning now to FIG. 16, the fork model 160 is shown together with an equation for its admittance $Y(s)$. The admittance $Y(s)$ is shown having a real component $A(\omega)$ and an imaginary component $jB(\omega)$. It is desired to determine the parameter values of R, L, C and $C_o$.

Figure 17:
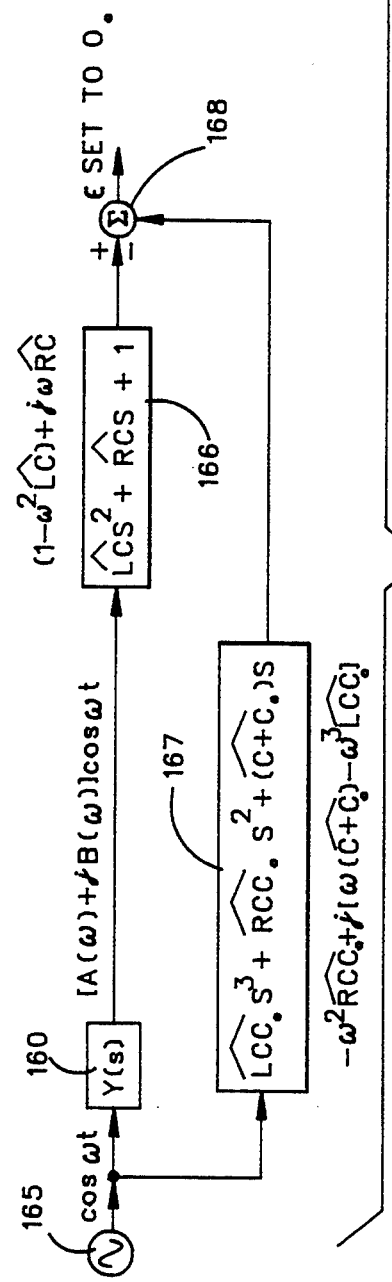
FIG. 17 is a circuit model for solving for component values in the mathematical equations of FIG. 16.

Turning now to FIG. 17, there is shown an expansion of FIG. 16 obtained by converting the equations of FIG. 16 to an admittance balance model block diagram in steady state. A signal generator 165 is assumed to provide a steady state cosine signal $\cos\omega t$ at the angular frequency $\omega$ driving the block 160 representing the fork model having the admittance $Y(s)$. The output of the fork model 160 is $A(\omega)+jB(\omega)$ times $\cos\omega t$. This signal from the fork model is passed through block 166, which has a transfer function that represents in steady-state the denominator $LCs^2+RCs+1$ of the rational expression for $Y(s)$ given in FIG. 16. The carrots over the terms LC and RC indicate that estimates of these quantities will be obtained by the solution procedure further described below. Simultaneously, the signal generator 165 drives a block 167, which represents in steady state the numerator $LCC_o s^3+RCC_o s^2+(C+C_o)s$ of the rational expression for $Y(s)$ given in FIG. 16. The difference shown as taking place in the subtractor 168 is an admittance model error $\epsilon$, which we wish to drive to zero.

Turning now to FIG. 18, there is illustrated the solution procedure for determining the parameter values R, L, C, and $C_o$ by setting the admittance error $\epsilon$ of FIG. 17 to zero. The set of equations in FIG. 18 show the effect of setting the real and imaginary parts of the admittance error $\epsilon$ equal to zero, and show how to solve for sets of the parameters R, L, C and $C_o$. The LC product, the RC product, and the $RCC_o$ product are obtained from the real part of the admittance error $\epsilon$ being set to zero. $C_o$ is then expressly extracted by dividing the $RCC_o$ product by the RC product. Given the LC and RC and $LCC_o$ products to plug into the imaginary part of the admittance error e being set to zero, the parameter C is expressly solved for. And, given C, L is obtained by dividing the LC product by C, and R is obtained by dividing the RC product by C.

In order to directly solve for the parameter values by the process in FIG. 18, three excitation frequencies are needed, which will be called $\omega_0$, $\omega_1$, $\omega_2$, and six measurements are needed to give A at $\omega_0$, $\omega_1$, $\omega_2$, and B at $\omega_0$, $\omega_1$, $\omega_2$. Setting the real part of the admittance error $\epsilon$ to zero at each of the three excitation frequencies gives three linear equations in the three unknowns (LC), (RC), and (RCC$_o$), so that solutions for these three unknowns can be expressed in closed form, for example, by Cramer's rule using determinants. A specific example of solving for the parameter values is given in the computer program listing of Appendix I.

Returning now to FIG. 15, there are shown circuits for the C$_o$ estimator that obtain the six measurements A and B at each of the three different frequencies $\omega_0$, $\omega_1$, $\omega_2$. The equation solver, which implements the solution procedure of FIG. 18 and corresponds to the program listing of Appendix I, is the block 170 in FIG. 15. The block 170 is fed by six values $A_0'/\omega_0$, $B_0'/\omega_0$, $A_1'/\omega_1$, $B_1'/\omega_1$, $A_2'/\omega_2$, and $B_2'/\omega_2$. These six values shown as inputs to the block 170 are inversely proportional to the respective frequencies $\omega_0$, $\omega_1$, $\omega_2$ due to the analog integrator in the readout electronics 162 of FIG. 6.

Each of the inputs to the block 170 is obtained by a respective one of six demodulators 172. Each demodulator includes a multiplier, and an accumulator circuit, as further shown below in FIG. 31.

Each of the demodulators 172 in FIG. 15 functions as a correlator. The accumulators are initially reset. Demodulation is performed continuously, and the computational block 170 may read its inputs at any time after an initial accumulation time required for the outputs of the accumulators to stabilize.

Each of the demodulators 172 demodulates the signal $v_1$ from the analog-to-digital converter 141 with a respective in-phase or quadrature-phase reference signal at $\omega_0$, $\omega_1$, or $\omega_2$. The frequency $\omega_0$ is conveniently the drive frequency $f_o/2\pi$ of the fork, at approximately the resonant frequency of the drive fork. The in-phase reference at the drive frequency $\omega_0$ is obtained from $v_g$, from the output of the automatic gain control 146 in FIG. 14. The other frequencies $\omega_1$ and $\omega_2$ are different from the drive frequency $\omega_o$. Preferably the drive fork is excited simultaneously and continuously by all three frequencies at all times during operation of the angular rate sensor.

Preferably, the frequencies $\omega_1$ and $\omega_2$ are higher than the drive frequency $\omega_0$, and the fork is excited at the higher frequencies at a relatively low signal level. At a higher frequency, the contribution to the admittance of the drive fork from the shunt capacitance $C_o$ is increased, so that the use of a higher frequency for at least one of $\omega_1$ and $\omega_2$ leads to a more accurate determination of C$_0$. Alternatively, the signal $v_g$ could be amplitude-modulated by a lower-frequency signal, to give a fork drive signal $v_d$ including a carrier component at $\omega_0$ and sidebands displaced from $\omega_0$ at plus and minus the lower-frequency signal.

Oscillators 173 and 174 in FIG. 15 generate the signals $\omega_1$ and $\omega_2$. Both frequencies are at less than one-half of the sampling frequency. A suitable construction for each of the oscillators is further described below in FIG. 20. The signal from each of the oscillators 173, 174 follows two paths. One path is to a respective summer 175, 176 to sum the signal with the drive signal at $\omega_0$. The alternate path is to a respective phase shifter 177, 178 that generates the in-phase reference and quadrature-phase reference for the respective frequency $\omega_1$ or $\omega_2$. A similar phase shifter 179 is used to generate an in-phase reference and a quadrature-phase reference for the drive frequency $\omega_o$. A suitable construction for the phase shifters is described below with reference to FIG. 19.

The circuitry of the shunt capacitance estimator 144 could be simplified, but that simplification would result in a loss of accuracy. For example, one may approximate the product LC as $1/\omega_0^2$, and this will become a very good approximation when the phase angle across the drive fork is adjusted, in response to the measured value of RC, to be $\arctan(RC_o\omega) \approx RC_o$. With this approximation, one of the signal generators, such as the signal generator 173 for $\omega_2$, and its respective phase shifter 177 and two of the correlators 172, could be eliminated.

A further simplification could be obtained by noting that the gain factor G generated by the automatic gain control is a function of the resistance R and the shunt capacitance $C_o$ when the fork is driven at $\omega_0 = 1/(LC)^{\frac{1}{2}}$:

$$G = (R_2 + (\omega_0 C_o))^{\frac{1}{2}}/C_f$$

where $C_f$ is the feedback capacitance of the integrator in FIG. 6. This equation for G, the approximation $LC = 1/\omega_0^2$, and the two equations $\text{Re}\{\epsilon\} = 0$ and $\text{Im}\{\epsilon\} = 0$ at the higher frequency $\omega_1$ of about 21 kHz, give four non-linear equations for the four unknowns R, L, C, and $C_o$. These equations can be solved by a suitable technique for solving systems of simultaneous non-linear equations, such as the well-known Newton-Raphson solution procedure. Due to the computational complexity of solving nonlinear equations, an estimate of $C_o$ would be computed at a relatively low rate, such as five Hertz, in a "background mode" of a digital data processor.

The Newton-Raphson solution procedure is an iterative method that starts with a predetermined trial solution $X^{[0]}$, which would represent nominal values for the parameters R, L, C and $C_o$. Successive approximations $X^{[j+1]}$ are then obtained by solving the simultaneous linear equations $$E_i(X^{[j]}) + \sum_{k=1}^{n} \left[\frac{\partial E_i}{\partial X_k}\right]_{X^{[j]}} (X_k^{[j+1]} - X_k^{[j]}) = 0$$

for $i = 1$ to $n$

This system of equations can be written as a matrix equation:

$$E(E^{[j]}) + [J](X_k^{[j+1]} + X_k^{[j]}) = 0$$

where [J] is the so-called Jacobjan matrix having the elements that are the partial derivatives $$\frac{\partial E_i}{\partial X_k}$$

evaluated at $X_k = X_k^{[j]}$. The system of equations can be solved by inverting the Jacobian matrix, to obtain the iterative equation:

$$X_k^{[j+1]} = X_k^{[j]} - [J]^{-1} E(X^{[j]})$$

If the charge amplifier (FIG. 6) transfer function is K/s, i.e., $R_f >> \omega_i C_f$, then the admittance expression In FIG. 16 becomes:

$$K\frac{LCC_o s^2 + RCC_o s + (C + C_o)}{LCs^2 + RCs + 1},$$

and the admittance balance equation becomes:

$$[A(\omega)+jB(\omega)][1-\omega^2 LC+j\omega RC]=K[(C+C_o)-\omega^2 LCC_o+j\omega RCC_o].$$

Equate the imaginaries and solve:

$$A(\omega)\omega RC+B(\omega)(1-\omega^2 LC)+K\omega RCC_o.$$

Using 3 excitation frequencies to obtain 3 equations, we can estimate RC, LC, and $RCC_o$ from which we extract $C_o$:

$$\widehat{C_o} = \frac{\widehat{RCC_o}}{\widehat{RC}}$$

Next we equate the reals:

$$A(\omega)[1-\omega^2 LC]-B(\omega)\omega RC=K[C+C_o-\omega^2 LCC_o],$$

and directly solve for C:

$$C = \frac{A(\omega)[1 - \omega^2 \widehat{LC}] - B(\omega)\omega\widehat{RC} + K\omega^2\widehat{LCC_o} - K\widehat{C_o}}{K},$$

where LC, RC, $LCC_o$, and $C_o$ are the previously computed estimates. Finally, $$\widehat{L} = \frac{\widehat{LC}}{\widehat{C}} \text{ and } \widehat{R} = \frac{\widehat{RC}}{\widehat{C}}.$$

The accumulator 172 outputs in FIG. 15 become simply $\frac{1}{2}A(\omega_i)$ and $\frac{1}{2}B(\omega_i)$, i=0,1,2.

Figure 19:
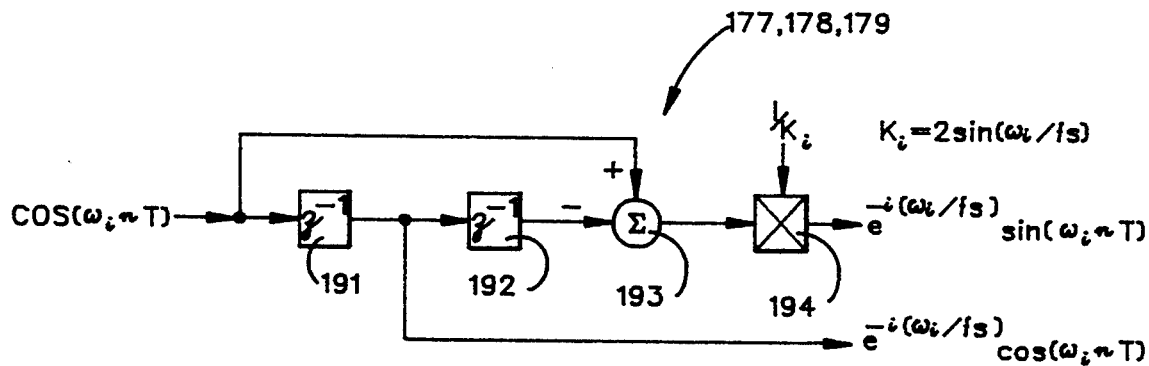
FIG. 19 is a schematic diagram of a phase shifter used in the shunt capacitance estimator of FIG. 15.

Turning now to FIG. 19, there is shown a schematic diagram for the phase shifter 177, 178 or 179 of FIG. 15. In this figure, and in the following figures, an adder or subtractor unit is designated by a circle including the Greek letter $\Sigma$ and the input nodes being labeled plus or minus. A multiplier is designated by a box circumscribing an X. A delay by a fixed integral number E of sampling periods T is denoted by a box including the z transform symbol $z^{-n}$. In the following figures, a scaling unit will be denoted by a box including a scale factor.

The phase shifter 177, 178, 1798 in FIG. 19 is a simple Hilbert transformer that generates exactly a 90° phase shift for all frequencies. The phase shifter includes a first delay unit 191 that delays the input signal $\cos(\omega_i nT)$ by one sampling period T, and a second delay unit 192 that delays the input signal by a second sampling period T. The output of the first delay unit 191 provides the in-phase reference $e^{-i(\omega_i/f_s)}\cos(\omega_i nT)$. To provide the quadrature-phase reference $e^{-i(\omega_i/f_s)}\sin(\omega_i nT)$, a subtractor 193 subtracts the output of the second delay unit 193 from the input signal $\cos(\omega_i t)$, and a scaling unit 194 scales the output of the subtractor 193 by a factor of $1/K_i$, where $K_i=2\sin(\omega_i/f_s)$.

It should be noted that the phase factor of $e^{-i(\omega_i/f_s)}$ has significance. Moreover, delay through the digital to analog converter 140, the drive electronics 161, the read-out electronics 162, and the analog-to-digital converter 141, also causes a phase shift. These phase shifts are most easily compensated by numerical adjustments in the computational block 170, because the computational block may compute a capacitance estimate $C_o$ at a much lower rate than the sampling frequency. In this case, the input parameters $A_i'$, $B_i'$ to the computational block 170 are compensated by a complex rotation by a predetermined phase angle $\theta_i$ such that $A_i+IB_i e^{-i\theta_i}(A_i'+iB_i')$. The predetermined phase angle $\theta_i$ for each frequency $\omega_i$ should be determined by a calibration procedure wherein the admittance of parasitic shunt capacitance is measured with the drive fork disconnected, and wherein the admittance of a precision resistor (in parallel with parasitic shunt capacitance) is measured with the precision resistor connected between the nodes 153, 154 in lieu of the drive fork.

Figure 20:
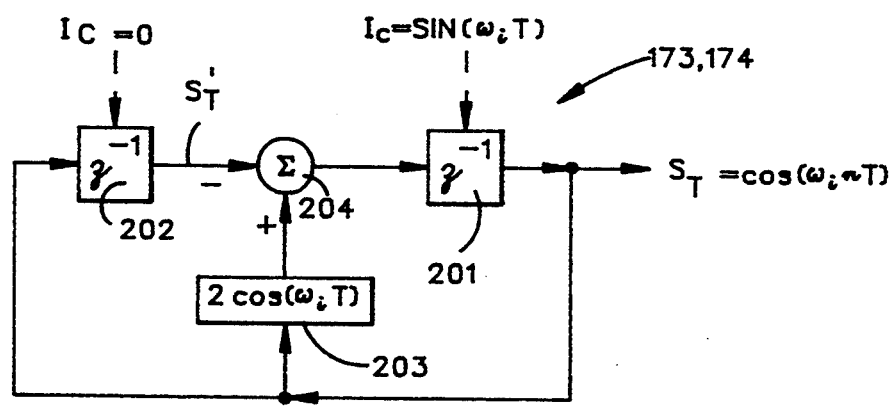
FIG. 20 is a schematic diagram of a test signal oscillator used with the shunt capacitance estimator of FIG. 15.

Turning now to FIG. 20, there is shown a schematic diagram of one of the oscillators 173, 174. The output signal $S_T=\cos(\omega_i nT)$ is the output of a delay unit or register 201 providing a delay of one sampling period T. The output signal $S_T$ is fed back to another delay unit or register 202 also providing a delay of one sampling period T, and scaled in a scaling unit 203 having a gain set to $2\cos\omega_i T$. This gain of the scaling unit 203 determines the frequency $\omega_i$ of the test signal $S_T$. A subtractor 204 subtracts the output of the scaling unit 203 from the output $S_T'$ of the delay unit 202 to produce a sum that is received by the delay unit 201. Initially, the delay unit 202 is set to a value of zero, and the delay unit 201 is set to a value of $\sin\omega_1 T$. These initial conditions (IC), for example, are preset values that are initially loaded into the registers or memory locations of the delay units 201, 202 when the inertial measurement unit 50 of FIG. 1 is first turned on.

Figure 21:
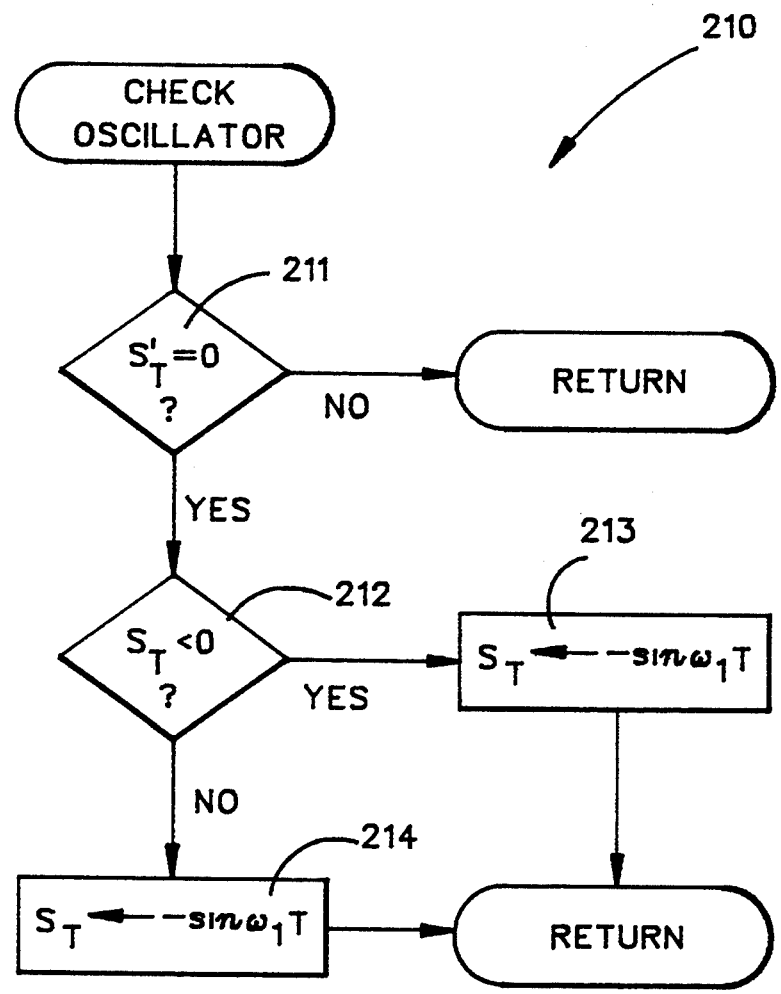
FIG. 21 is a flowchart of a procedure for resetting the oscillator of FIG. 20 to compensate for round-off error.

Turning now to FIG. 21, there is shown a flowchart 210 of a procedure for selectively resetting the oscillator (173 or 174 in FIG. 20) from time-to-time to prevent amplitude drift in the oscillator signal $S_T$ due to accumulation of roundoff error. The procedure of FIG. 21, for example, is performed once during each sampling time. When the synchronous logic of FIG. 14 is implemented as a programmed digital signal processor, for example, the procedure of FIG. 21 is specified by a routine performed when the processor is interrupted at the sampling frequency $f_s$.

In the first step 211, the value of the output $S_T'$ of the delay unit 202 in FIG. 20 is compared to zero. If it is not zero, then no resetting of the oscillator is performed for the sampling time. Otherwise, if the value of $S_T'$ is equal to zero, then in step 212, the value of the output signal $S_T$ from the delay unit 201 in FIG. 20 is compared to zero. If the value of the output signal $S_T$ is less than zero, then in step 213 the delay unit 201 in FIG. 20 is reset in order to set the value of the output signal $S_T$ to a value of $-\sin\omega_i T$. Otherwise, in step 214, when the value of the output signal $S_T$ is greater than zero, the delay unit 201 in FIG. 20 is reset in order to set the value of the output signal $S_T$ to a value of $\sin\omega_1 T$.

Figure 22:
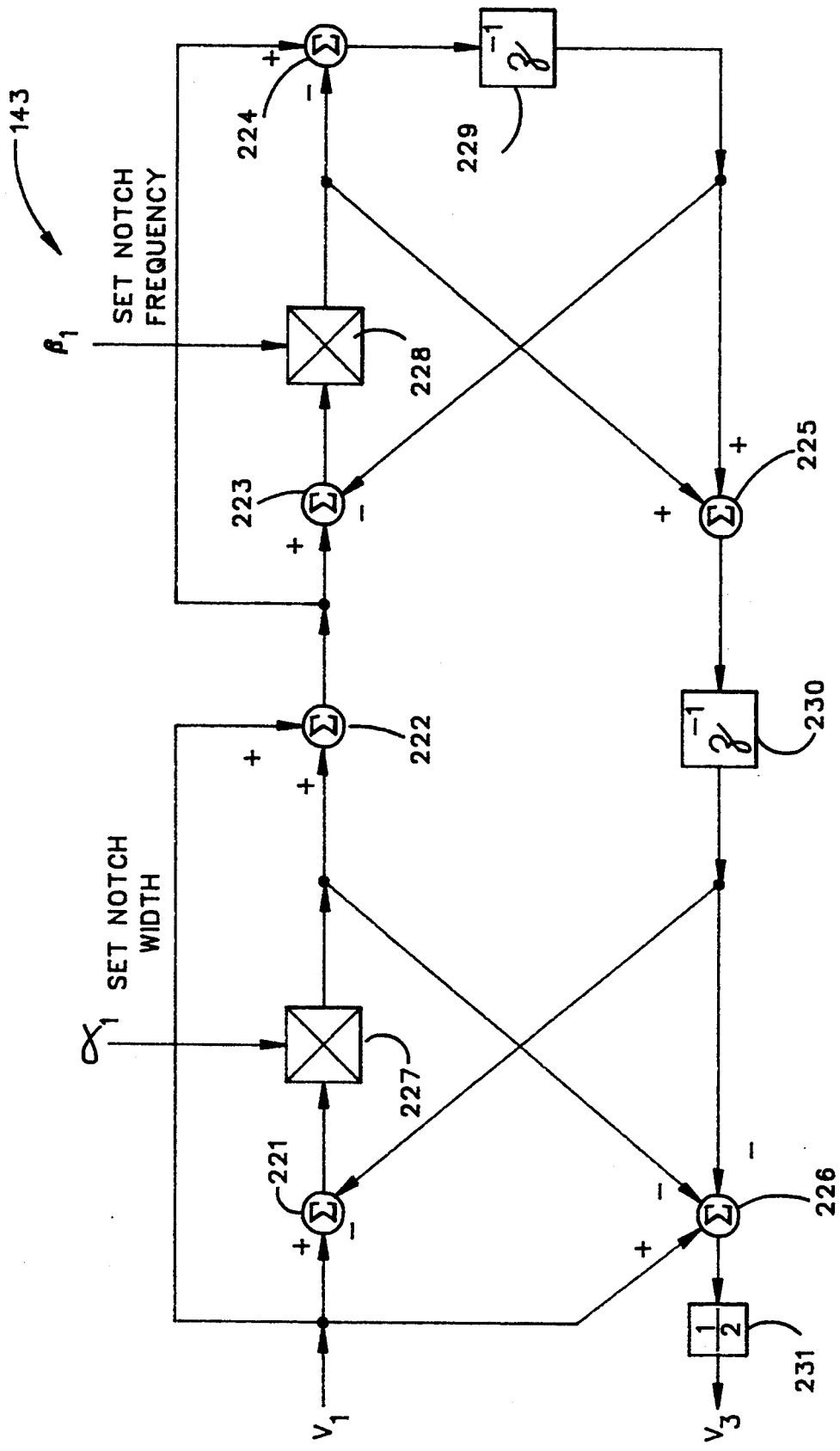
FIG. 22 is a schematic diagram of the tracking filter of FIG. 15.

Turning now to FIG. 22, the tracking filter 143 is shown in greater detail. The tracking filter includes six summing nodes 221, 222, 223, 224, 225, 226, two multipliers 227, 228, and two delay units 229 and 230 each providing a delay of one sampling period T. The tracking filter also includes a scaling unit 231 having a scale factor of $\frac{1}{2}$, which is conveniently obtained by an arithmetic right shift operation in a programmed digital signal processor. The passband-width of the tracking filter is set by a parameter $\alpha_1$ that is produced by the reference signal generator 145 of FIG. 14. The passband center frequency of the tracking filter is set by a parameter $\beta_1$ that is also produced by the reference signal generator 145 of FIG. 14. Further details regarding the tracking filter 143 are disclosed in the tracking filter design program listed in Appendix II.

Figure 23:
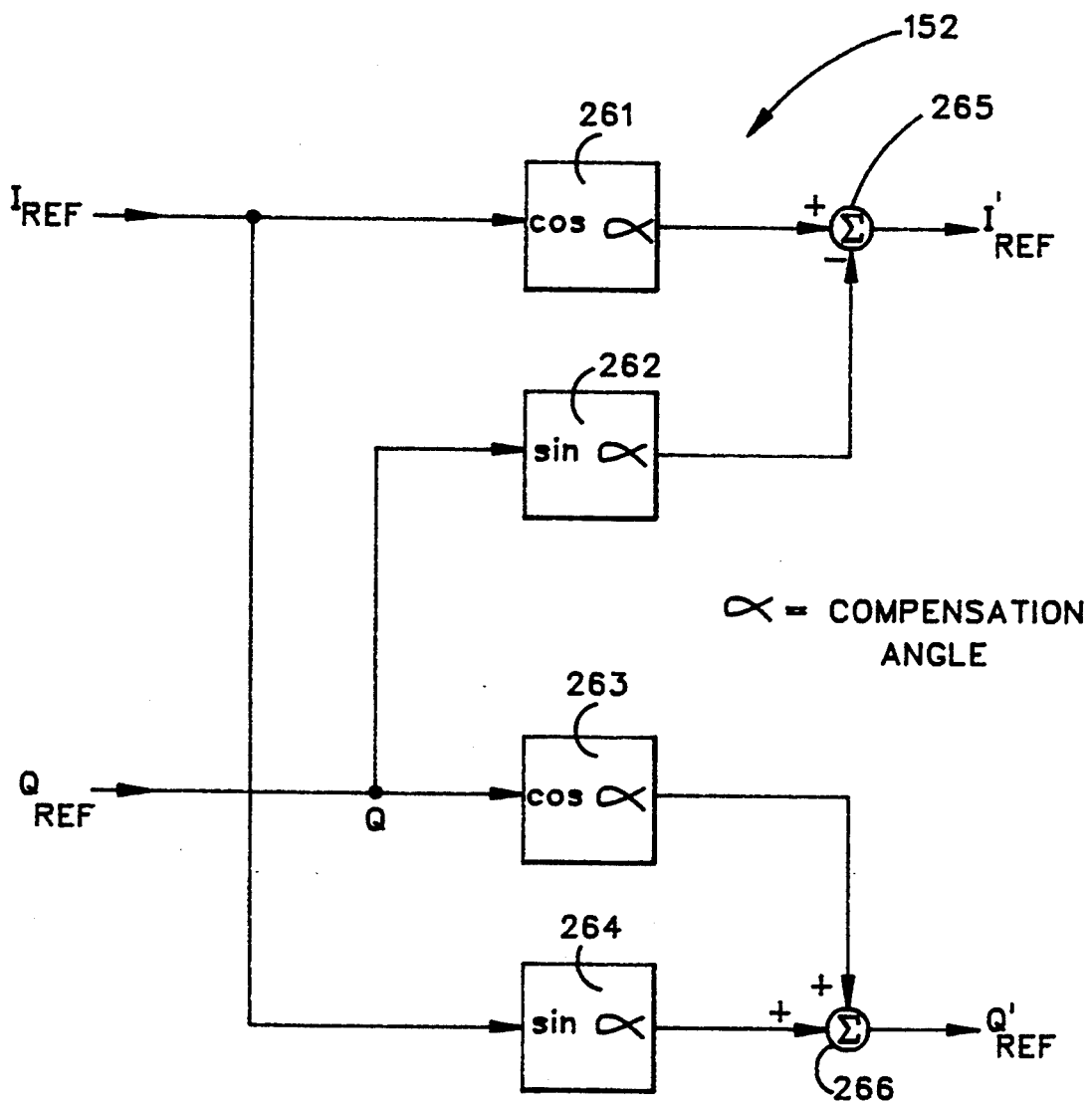
FIG. 23 is a schematic diagram of a rotator introduced in FIG. 14.

Turning now to FIG. 23, there is shown a schematic diagram of the rotator 152. The complex rotation is provided by four scaling units 261, 262, 263, and 264, a subtractor 265 which produces the transformed in-phase reference signal $I'_{REF}$, and an adder 266 which produces the transformed quadrature-phase reference signal $Q'_{REF}$. The compensation angle $\alpha$ is adjusted during calibration of the system, as described above with reference to FIG. 14, and the sine and cosine of the compensation angle are stored in nonvolatile memory. During the operation of the system, the sign and cosine of the compensation angle $\alpha$ are retrieved from nonvolatile memory to be multiplied by the in-phase reference $I_{REF}$ and the quadrature-phase reference $Q_{REF}$ to perform the scaling functions of the scaling units 261, 262, 263, and 264.

Figure 24:
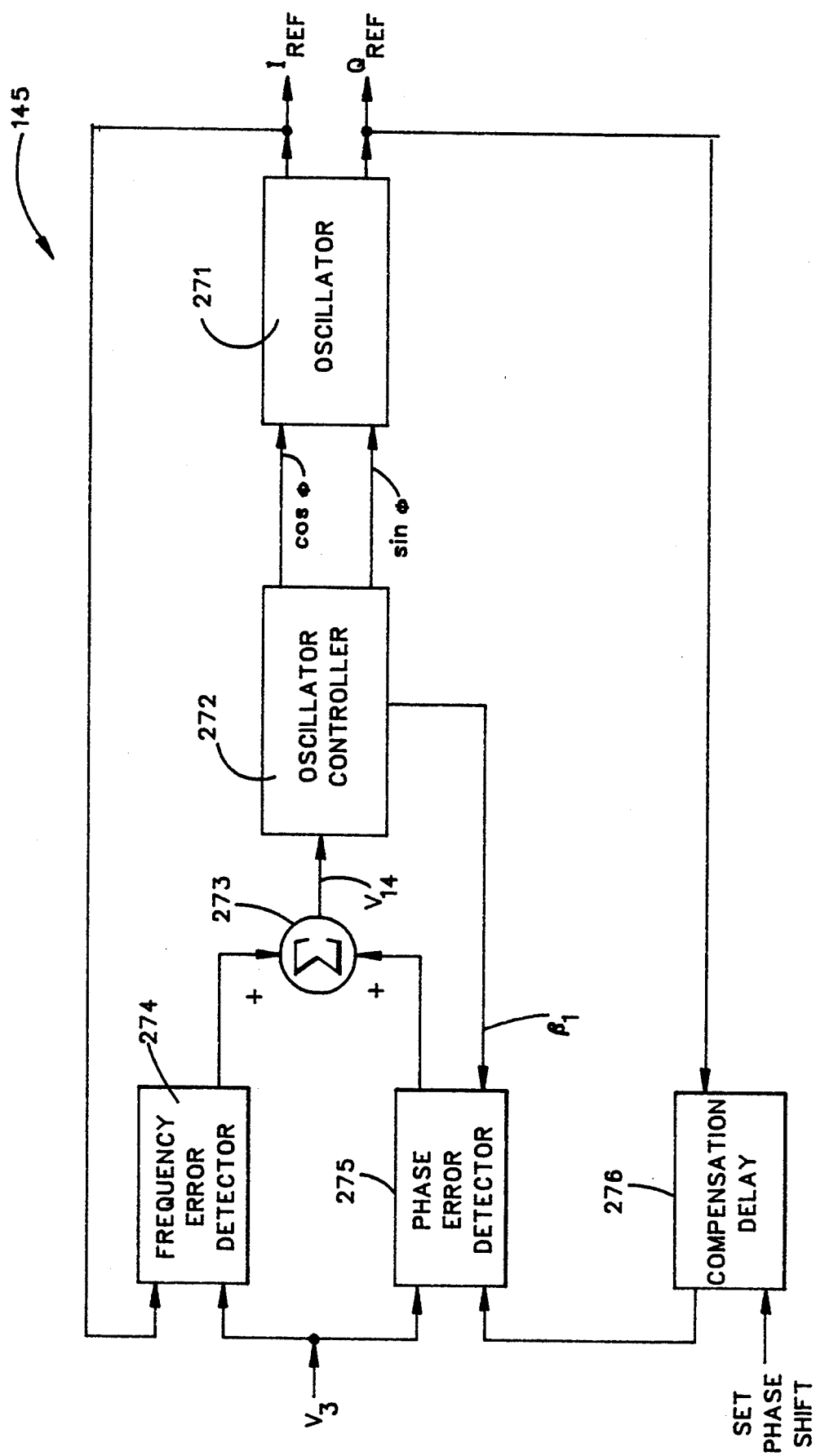
FIG. 24 is a schematic diagram of a reference signal generator introduced in FIG. 14.

Turning now to FIG. 24, there is shown a schematic diagram of the reference signal generator 145. The in-phase reference signal $I_{REF}$ and the quadrature-phase reference signal $Q_{REF}$ are generated by an oscillator 271 that is phase-locked to the sinusoidal component of the signal $v_3$ at frequency of oscillation $f_o$ of the drive fork. The oscillator 271 receives a pair of frequency control signals $\cos\phi$ and $\sin\phi$ from an oscillator controller 272. The oscillator controller 272 integrates an error signal $v_{14}$ from an adder 273. The adder adds a frequency error signal from a frequency error detector 274 to a phase error signal from a phase error detector 275. The frequency error detector 274 detects any difference in frequency between the frequency of the signal $v_3$ and the frequency of the oscillator 271. The phase error detector 275 detects the difference in phase between the signal $v_3$ and the quadrature-phase reference signal $Q_{REF}$ after the quadrature-phase reference signal is delayed by a predetermined phase shift in a compensating delay unit 276. This predetermined phase shift is adjusted to set the phase shift across the drive fork. To compensate for variations in the shunt capacitance, this predetermined phase shift could be adjusted for a phase shift of $\arctan(RC_o\omega) \approx RC_o\omega$ across the drive fork, based on the measured values of R and $C_o$, so that the drive fork is driven at the frequency $\omega = 1/(LC)^{\frac{1}{2}}$. The "set phase shift" signal in FIG. 26, for example, is computed as a predetermined function of the product $RC_o$ to obtain the phase shift of $\arctan(RC_o\omega) = RC_o\omega$ across the drive fork. This predetermined function also includes a term proportional to frequency to compensate for delay and phase shift through the digital-to-analog converter (140 in FIG. 15), the drive electronics (161 in FIG. 15), the read-out electronics (162 in FIG. 15) and the analog-to-digital converter (141 in FIG. 15). For example, the "set phase shift" signal could be computed as a polynomial of the drive frequency, such as:

$$d_0 + \omega(d_1 + d_2 RC_0) + \omega^2 d_3.$$

The phase error detector 275 also receives the passband center-frequency control parameter $\beta_1$ from the oscillator controller 272.

Figure 25:
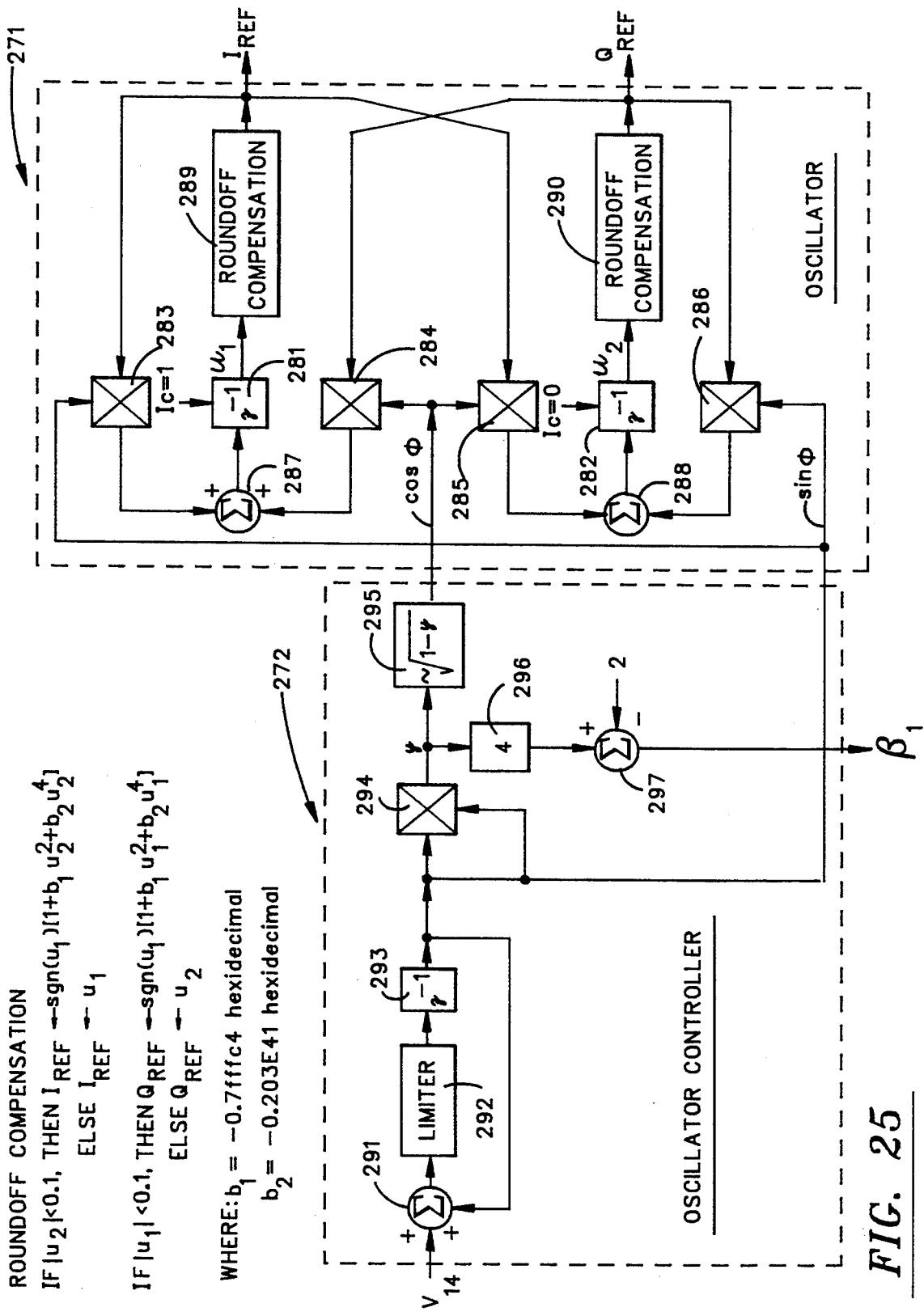
FIG. 25 is a schematic diagram of an oscillator and an oscillator controller introduced in FIG. 24.

Turning now to FIG. 25, there is shown a schematic diagram of the oscillator controller 272 and the oscillator 271 introduced in FIG. 24. As shown in FIG. 25, the oscillator includes two delay units 281, 282, four multipliers 283, 284, 285, 286, two summing nodes 287, 288, and two roundoff compensation units 289, 290. The frequency control signal $\cos\phi$ sets the gain of the multipliers 284, 285, and the frequency control signal sine sets the gain of the multipliers 283, 286. The center frequency of the oscillator is $(\frac{1}{4})f_s$, and it occurs when $\phi = 0$. In general, the frequency of the oscillator is $\omega = \theta/T$, where $\theta = \pi/2 + \phi$ radians. The delay unit 281 is set to an initial condition (IC) of one, and the delay unit 282 is set to an initial condition of zero. These initial conditions ensure that the $I_{REF}$ signal starts out as a cosine, and the $Q_{REF}$ signal starts out as a sine.

The outputs of the delay units 281 and 282 are indicated as $u_1$ and $u_2$, respectively, which are inputs to the roundoff compensation units 289, 290, respectively. The roundoff units implement the following logic:

IF $|u_2| < 0.1$, THEN $I_{REF} \leftarrow \text{sgn}(u_1)[1 + b_1 u_2^2 + b_2 u_2^4]$
  ELSE $I_{REF} \leftarrow u_1$
IF $|u_1| < 0.1$, THEN $Q_{REF} \leftarrow \text{sgn}(u_2)[1 + b_1 u_1^2 + b_2 u_1^4]$
  ELSE $Q_{REF} \leftarrow u_2$
WHERE: $b_1 = -0.7\text{fffc}4$ hexadecimal
  $b_2 = -0.203E41$ hexadecimal The roundoff compensation units prevent the accumulation of roundoff error. When one channel has an output that is close to zero, the output of the other channel is computed to a high degree of precision.

The oscillator controller 272 has an accumulator or integrator including an adder 291, a limiter 292, and a delay unit or register 293. Therefore, the phase error in the signal $v_{14}$ is integrated to obtain the frequency offset $\sin\phi$. The limiter 292 limits the frequency of oscillation of the oscillator 271 to within $\frac{1}{8}f_s$ and $\frac{3}{8}f_s$ where $f_s$ is the sampling frequency. To compute the corresponding control parameter $\cos\phi$, a multiplier 294 computes $\sin^2\phi$, and a computational unit 294 computes the square root of one minus y, where y is $\sin^2\phi$. Preferably, the square root of one minus y is computed by an 8-term Chebychev polynomial approximation:

$$\sqrt{1-y} \approx \sum_{i=0}^{7} a_i y^i$$

where:
  $a_0 = 1$
  $a_1 = -0.800044$ hexadecimal
  $a_2 = -0.1FF585$ hexadecimal
  $a_3 = -0.109BC8$ hexadecimal
  $a_4 = -0.05AOC5$ hexadecimal
  $a_5 = -0.178DE2$ hexadecimal
  $a_6 = 0.1B649B$ hexadecimal
  $a_7 = -0.2093C3$ hexadecimal To generate the passband center-frequency parameter $\beta_1$, the oscillator controller 272 has a scaling unit 296 that scales the value of y by a factor of four (an arithmetic left shift by two binary places), and a subtractor 297 that generates the parameter $\beta_1$ by subtracting two from the output of the scaling unit.

Figure 26:
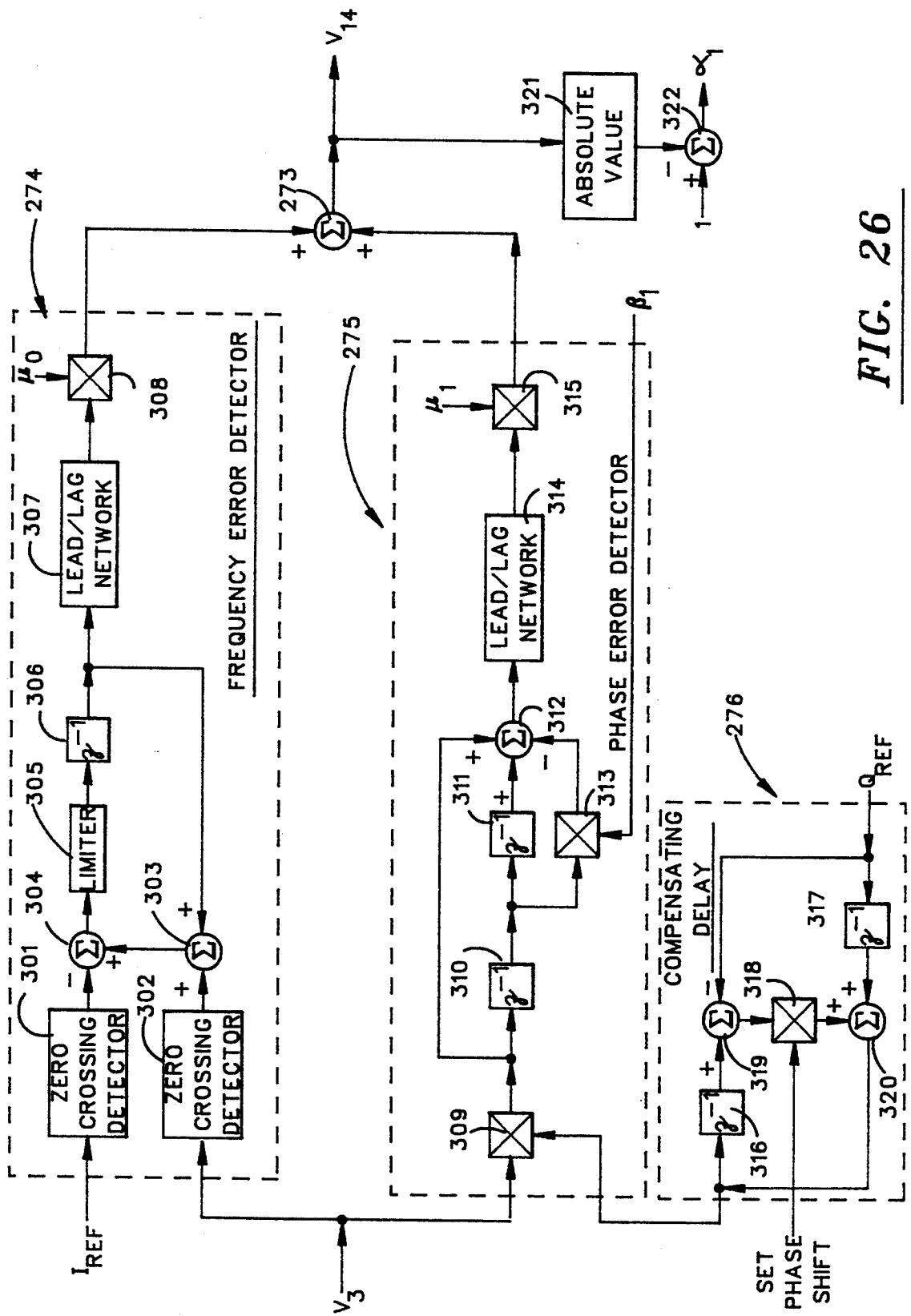
FIG. 26 is a schematic diagram of a frequency-error detector, a phase-error detector, and a compensating delay introduced in FIG. 24.

Turning now to FIG. 26, there are shown further details of the frequency error detector 274, the phase error detector 275, and the compensating delay 276. The frequency error detector 274 has at its front end two zero-crossing detectors, 301 and 302. The frequency error detector 274 operates by counting zero crossings and comparing the number of times the signal $I_{REF}$ from the oscillator (271 in FIG. 24) passes through zero. The output of each zero crossing detector 301, 302 is one when a zero crossing occurs and zero the rest of the time. The outputs of the zero crossing detectors 301, 302 are combined through a pair of summing nodes 303 and 304, which together take the difference of the counts from the two zero crossing detectors. The difference of the two counts represents a frequency error; that frequency error is summed in an accumulator, which uses the summing nodes 303, 304 and further includes a limiter 305 and a delay unit or register 306. The accumulated frequency error is then fed to a lead/lag network 307, which provides stability for the frequency error control loop. A gain scaling unit 308 is also used to help establish the stability by setting the loop gain of the frequency error control loop. The output of the gain scaling unit 308 is therefore the frequency error that drives the oscillator controller (272 in FIG. 24). If there is no frequency error, the output of the scaling unit 308 will be zero, and the adder 273 and the subsequent oscillator controller (272 in FIG. 24) will be driven only by the phase error signal from the phase error detector 275.

To generate the phase error, a multiplier 309 multiplies the input signal $v_3$ by a delayed reference signal from the delay unit 276. The AC component of the product is cancelled by a notch filter, which consists of delays 310, 311, an adder 312, and a multiplier 313. The multiplier 313 receives the passband centerfrequency parameter $\beta_1$ from the oscillator controller (272 in FIG. 24), so that the notch filter is tuned to reject the AC component at twice the frequency of oscillation. The output of the notch filter is the raw phase error, which passes through its own separate lead/lag network 314 to stabilize the phase error correction loop, and a multiplier 315 to set the gain of the phase error correction loop.

The compensating delay 276 is an all-pass filter that provides an adjustable phase delay, in order to adjust the phase shift across the drive fork. The compensating delay 276 includes two delay units 316, 317, a multiplier 318, a subtractor 319, and an adder 320. The coefficient of the multiplier 318 sets the phase shift of the compensating delay 276.

To generate the passband-width parameter $\alpha_1$, an absolute value unit 321 produces the absolute value of the signal $v_{14}$, and a subtractor 322 subtracts the absolute value from a constant value of 1.

Figure 27:
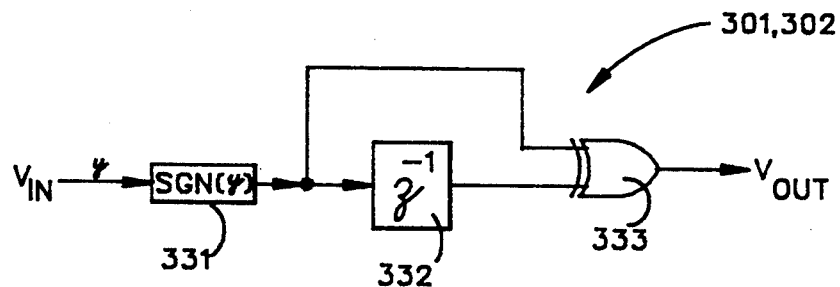
FIG. 27 is a schematic diagram of a zero crossing detector used in the frequency-error detector of FIG. 26.

Turning now to FIG. 27, there is shown a schematic diagram of one of the zero crossing detectors 301, 302 used in the frequency error detector 274 of FIG. 26. As shown in FIG. 27, the zero crossing detector has a sign extractor 331 that extracts the sign of the input signal $V_{IN}$. The extracted sign is delayed in a delay unit 332. An exclusive-OR gate 333 compares the current sign from the sign extractor 331 to the delayed sign in the delay unit, and signals a zero crossing when the signs are different.

Figure 28:
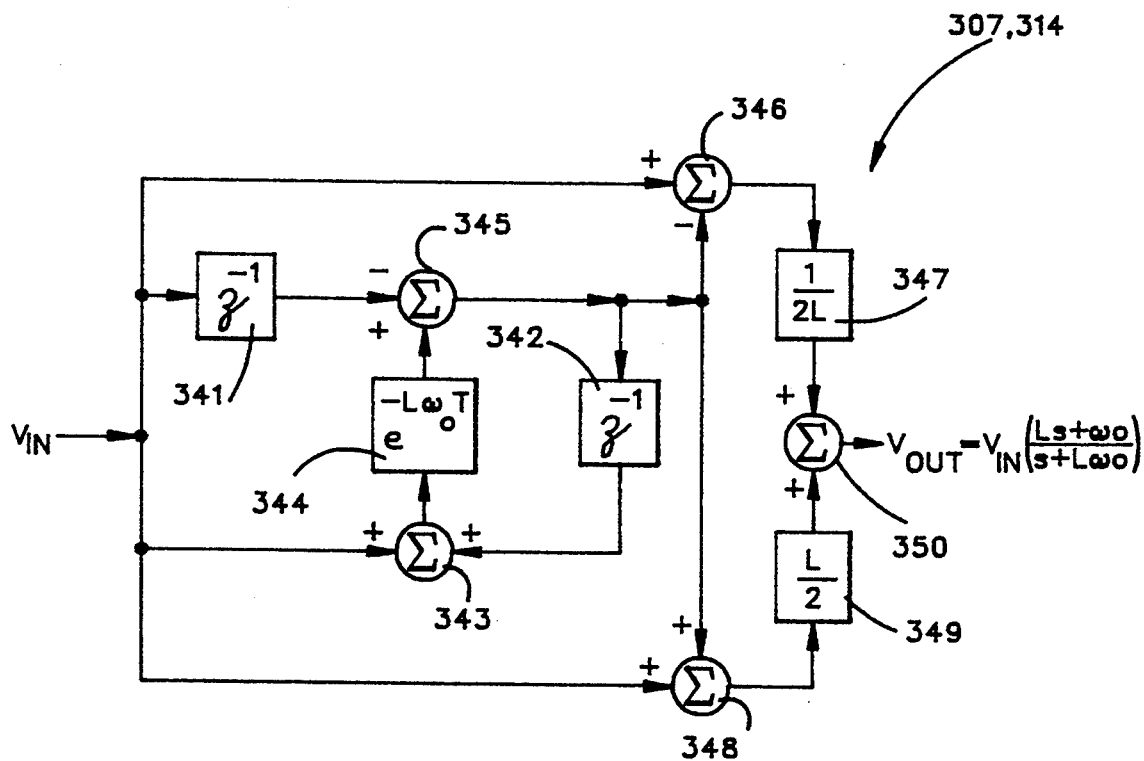
FIG. 28 is a schematic diagram of a lead/lag network used in the frequency-error detector and in the phase-error detector of FIG. 26.

Turning now to FIG. 28, there is shown a schematic diagram of the lead/lag network 307 or 314 introduced in FIG. 26. The lead/lag network includes a first delay unit 341 which delays the input signal $v_{IN}$ by one sampling period T, and a second delay unit 342 having a delay of one sampling period T and having a feedback path in order to provide the pole in the frequency response of the lead/lag network. A summer 343 sums the output of the second delay unit 342 with the input signal $V_{IN}$, and the sum is scaled by a scale factor having a value of $e^{-L\omega_o T}$ in a scaling unit 344. The parameter L, for example, has a value of 5.9. A subtractor 345 subtracts the output of the first delay unit 341 from the output of the scaler 344 to provide a difference that is received by the second delay unit 342.

In order to produce the output signal $v_{OUT}$ of the lead/lag network, a subtractor 346 subtracts the output from the subtractor 345 from the input $V_{IN}$, and a scaling unit 347 scales the difference by the factor of $\frac{1}{2}L$. An adder 348 adds the output of the subtractor 345 to the input signal $v_{IN}$, and a scaling unit 349 scales the sum by the factor L/2. Finally, an adder 350 adds the output of the scaling unit 347 to the output of the scaling unit 349 to produce the output signal $v_{OUT}$.

Figure 29:
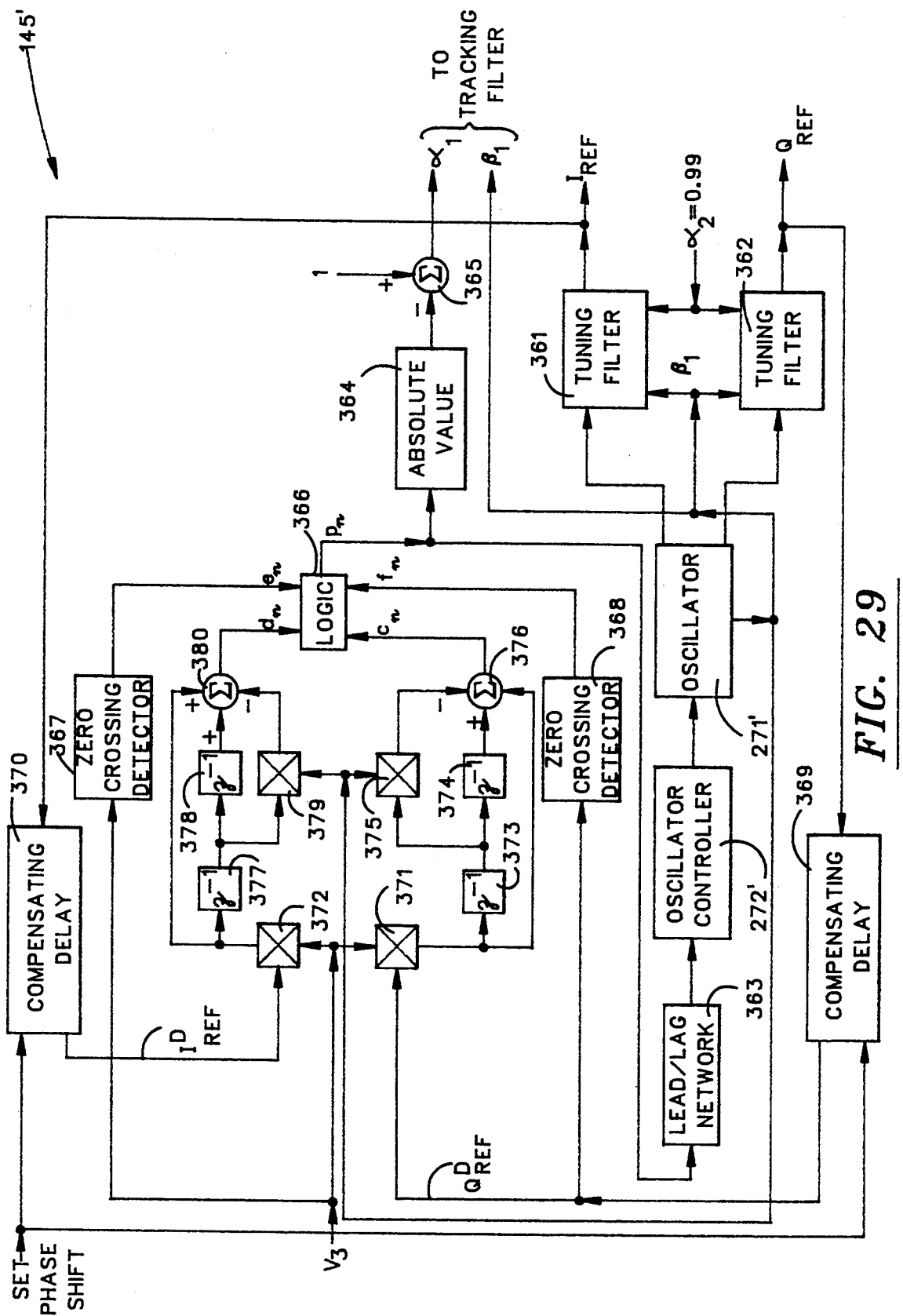
FIG. 29 lock diagram of an alternative construction for the reference frequency generator used in the system of FIG. 14.

Turning now to FIG. 29, there is shown an alternative embodiment of a reference signal generator 145' that gives better performance than the circuit of FIGS. 24 and 26. The reference signal generator 145' of FIG. 29, however, is more complex and expensive.

The reference signal generator 145' of FIG. 29 uses an oscillator 271' and an oscillator controller 272' that are similar to the oscillator 271 and oscillator controller 272 shown in FIG. 25. The in-phase reference signal $I_{REF}$ and the quadrature-phase reference signal $Q_{REF}$, however, are obtained from a pair of tuning filters 361, 362 that filter the in-phase and quadrature phase signals from the oscillator 271'. The noise floor of the output of the oscillator 271', for example, is about $-125$ db, and the filters 361 and 362 provide an improvement of about 30 dB by removing some spikes in the frequency domain. The filters 361 and 362 are similar to the tracking filter 143 in FIG. 22, and the filters 361 and 362 are tuned to the frequency of oscillation by receiving the passband center-frequency parameter $\beta_1$ from the oscillator 271'.

The front end of the reference signal generator 145' of FIG. 29 has a slightly more complex system for determining the phase and the frequency error. Performance is slightly improved, and another advantage is that one common lead/lag network 363 is now sufficient to stabilize both the frequency and the phase error control loop. The lead/lag network 363 is similar to that shown in FIG. 28. As further shown in FIG. 29, the passband-width parameter $\alpha_1$ is generated by an absolute value unit 364 responsive to the error signal $\rho_n$, and a subtractor 365 that produces the parameter $\alpha_1$ by subtracting the absolute value of the error signal $\rho_n$ from one.

The error signal $\rho_n$ is generated by logic 366 responsive to a zero crossing detector 367 producing a signal $e_n$ indicating zero crossings in the input signal $v_3$, a zero crossing detector 368 producing a signal $f_n$ indicating zero crossings in a delayed quadrature reference signal, and signals $c_n$ and $d_n$ produced by complex demodulation of the input signal $v_3$ by the delayed quadrature reference signal and a delayed in-phase reference signal. The zero crossing detectors 367, 368 have the construction shown in FIG. 27. The delayed quadrature-phase reference signal is produced by a compensating delay unit 369 that delays the $Q_{REF}$ signal by a selected phase shift, and the delayed in-phase reference signal is produced by a compensating delay unit 370 that delays the $I_{REF}$ signal by the same selected phase shift. Each of the compensating delay units 369, 370 is an all-pass filter similar to the delay unit 276 shown in FIG. 26.

The complex demodulation of the input signal $v_3$ is performed by a pair of multipliers 371, 372. The AC component of the product from the first multiplier 371 is removed by a notch filter including delay units 373, 374, a multiplier 375, and a summing node 376. The summing node 376 produces the demodulated signal $c_n$ which is essentially a phase error signal. In a similar fashion, the AC component of the product from the second multiplier 372 is removed by a notch filter including delay units 377, 378, a multiplier 379, and a summing node 380. The summing node 380 produces the demodulated signal $d_n$. The logic 366 produces the error signal $\rho_n$ from the signals $c_n$, $d_n$, $e_n$, and $f_n$, as follows:

```
IF a "true" fn does not occur between
   2 consecutive "true" outputs of en
      THEN P0←true
      ELSE P0←false
IF a "true" en does not occur between
   2 consecutive "true" outputs of fn
      THEN P1←true
      ELSE P1←false
bn←pn−1
IF P0.AND.P1.AND.(dn > 0).AND.[sgn(bn) = sgn(cn)]
      THEN pn←cn
      ELSE IF NOT(P0).AND.NOT(P1).AND. (dn <
  0).AND.sgn (b)n = sgn(cn)
           THEN pn←0.5*sgn(cn)
           ELSE IF (bn = 1).AND.[sgn(bn)≠sgn(cn)].AND.
  NOT(P0).AND > NOT(P1)
              THEN pn←0.5*bn
              ELSE IF P0
                 THEN pn←−0.5
                 ELSE IF P1
                    THEN pn←−0.5
```

Figure 30:
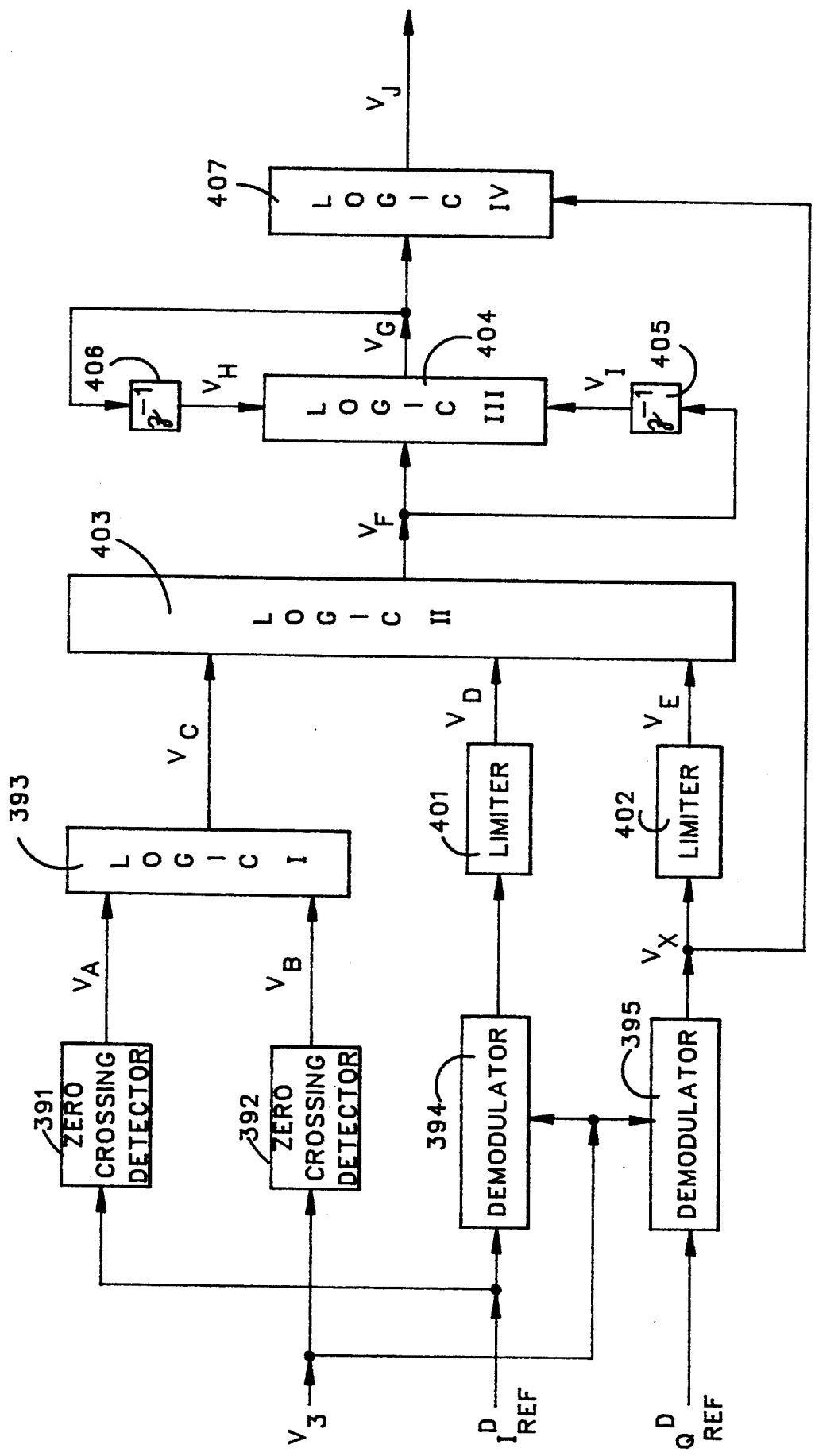
FIG. 30 is a block diagram of an alternative construction for the frequency-error detector and phase-error detector as used in FIG. 28 or FIG. 29.

Turning now to FIG. 30, there is shown an alternative discriminator and phase detector that could be substituted for the components 366 to 368 and 371 to 380 in FIG. 29. Zero-crossing detectors 391 and 392 each have the construction as shown in FIG. 27. A first logic block 393 is responsive to the zero crossing detectors to detect a significant frequency difference between the input signal $V_3$ and the frequency of oscillation as follows:

```
LOGIC I:
   IF two consecutive VB = true
      THEN Vc←1
      ELSE IF two consecutive VA = true
         THEN Vc←−1
         ELSE Vc←0
```

The circuit in FIG. 30 includes a first demodulator 394 for demodulating the input signal $V_3$ with the delayed in-phase signal $I_{REF}^D$, and a second demodulator 395 for demodulating the input signal $V_3$ with the delayed quadrature-phase signal $Q_{REF}^D$. The demodulators 394 and 395 have a similar construction.

Figure 31:
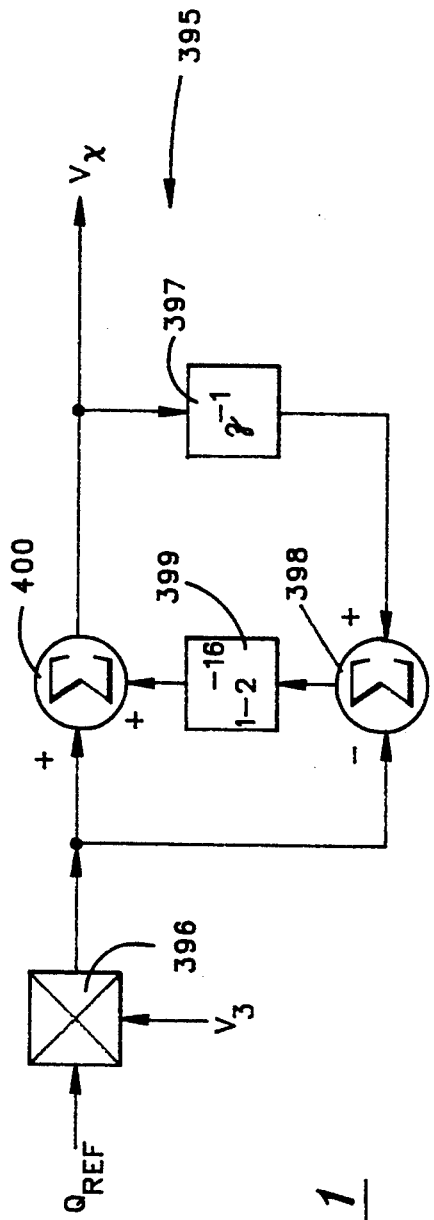
FIG. 31 is a schematic diagram of a demodulator used in FIG. 30.

As shown in FIG. 31, the demodulator 395 consists of a multiplier 396 and a simple low-pass filter including a delay unit 397, a subtractor 398, a scaling unit 399, and an adder 400.

Returning to FIG. 30, the output of each of the demodulators 394, 395 drives a respective limiter 401, 402 that saturates at ±1. The outputs $V_D$, $V_E$ of the limiters are received in a second logic unit 403. The second logic unit 403 implements the following logic:

```
LOGIC II:
   IF Vc = 1 .OR. [(Vc = 0).AND.(VD < 0).AND.(VE > 0)]
      THEN VF←1
      ELSE IF Vc = −1 .OR.
   [(Vc = 0).AND.(VD < 0).AND.(VE < 0)]
      THEN VF←−1
```
```
-continued
      ELSE VF←0
```

The second logic unit 403 drives a third logic unit 404 and a delay unit 405. The third logic unit 404 is responsive to the delay unit 405, and is also responsive to a delay unit 406 feeding back the output $V_G$ of the third logic unit 404. The purpose of the delay unit 406 is to provide hysteresis: in case there is any tendency of the system to switch early, it builds some conservatism into its decision-making, whereas delay unit 405 provides a slight lead or anticipation capability. The third logic block implements the following logic:

```
LOGIC III:
   IF VF = VI
      THEN VG←VF
      ELSE VG←VH
```

And finally, a fourth logic block 407 receives the output $V_G$ from the third logic block 404 and the output $V_x$ from the demodulator 395 and decides whether to operate in a linear region or a nonlinear region. To operating in a linear region, the fourth logic block 407 passes the output $V_x$ from the demodulator 395 as the control signal $V_J$, which is analogous to the control signal $\rho_n$ in FIG. 29. Otherwise, the fourth logic block 407 passes the output $V_G$ from the third logic block 404, which represents a saturated phase control signal of $\pm \pi$ radians. The fourth logic block 407 implements the following logic:

```
LOGIC IV:
   IF VG = 1
      THEN VJ←2π
      ELSE IF VG = −1
         THEN VJ←−2π
         ELSE VJ←Vx
```

In short, the circuit in FIG. 30 provides a discrimination characteristic that is a traditional discriminator between the limits of ±n and that provide a full scale control signal outside that region.

Figure 32:
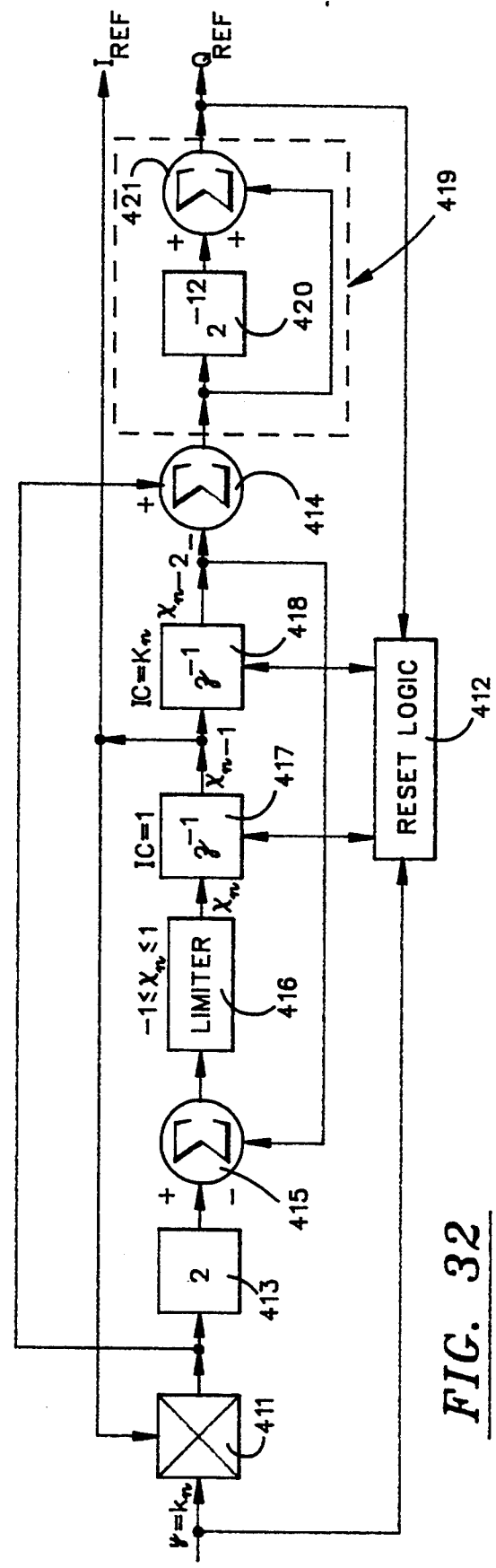
FIG. 32 is a schematic diagram of an alternative construction of an oscillator that could be used in FIG. 25 or FIG. 29.

Turning now to FIG. 32, there is shown an alternative embodiment of an oscillator, which could be used in place of the oscillator 271 of FIG. 25. The oscillator shown in FIG. 32 is much simpler than that of FIG. 25; however, there is less control of the quadrature channel. The oscillator 271 in FIG. 25 provides a sine and a cosine whose amplitudes are exactly the same. This is not necessarily the case with the oscillator in FIG. 32.

As shown in FIG. 32, an input $y = K_n$ determines the frequency of oscillation. This input $y = K_n$ controls the scale factor of a multiplier 411 and also drives a reset logic block 412. The product from the multiplier 411 is scaled by a factor of 2 in a scaling unit 413, for example, an arithmetic left shift by one binary place. The multiplier 411 and scaling unit 413 together give the traditional 2cosωT gain term, which determines the frequency of oscillation of a second order digital feedback loop. Also, the product from the multiplier 411 drives a subtractor 414 to form a 90° phase shifter. The output of scaling unit 413 drives a subtractor 415, which in turn drives a limiter 416. The limiter limits its output signal $x_n$ to ±1. The limiter 416, according to conventional linear theory, is not needed, but in practice the limiter 416 is used to compensate for round-off due to the finite arithmetic and the time variant nature of the oscillator during frequency adaptation. Therefore, in practice, the oscillator is nonlinear, and amplitude stabilization is provided by the limiter 416. Delay units 417 and 418 complete the second-order oscillator configuration. The subtractor 415 subtracts the output of the delay unit 418 from the output of the scaling unit 413 to complete the feedback loop of the oscillator.

The subtractor 414 subtracts the output of the delay unit 418 from the output of the multiplier 411 to produce a difference signal which is in quadrature with the signal out of delay unit 417. There is an exact 90° phase shift. The amplitude, however, is frequency dependent. There is an amplitude-correction approximation circuit 419, which consists of scaling unit 420, such as an arithmetic right shift by 12 binary places, and an adder 421. The adder 421 produces the quadrature-phase signal $Q_{REF}$. This output also drives the reset logic 412.

The reset logic 412 determines the initial conditions of the two delay units 417 and 418. The reset logic also provides the resetting for roundoff correction. The reset logic implements the following functions:

RESET LOGIC:

IF $|X_{n-1}| = 1$ THEN $x_{n-2} \leftarrow K_n \operatorname{sgn}(x_{n-1})$

IF $|x_{n-2}| = 1$ THEN $x_{n-1} \leftarrow K_n \operatorname{sgn}(x_{n-2})$

IF $Q_{REF} = 0$ THEN $x_{n-1} \leftarrow 1 \operatorname{sgn}(x_{n-1})$, $x_{n-2} \leftarrow K_n \operatorname{sgn}(x_{n-1})$ The combination of the reset logic 412 and the limiter 416 stabilizes the amplitude of the oscillator. Without the limiter 416, the amplitude of the oscillator output grows during frequency adaptation, except the reset logic 412 forces the amplitude back at somewhat random times, causing spurious signals. Although the oscillator in FIG. 32 is a time-varying nonlinear system, the limiter 416 in combination with the reset logic 412 makes the oscillator behave substantially like a time-invariant linear system. The advantage of the oscillator of FIG. 32 is that it is much simpler than the oscillator 271 of FIG. 25, and therefore can be used when needed to avoid overloading of a digital signal processor.

Figure 33:
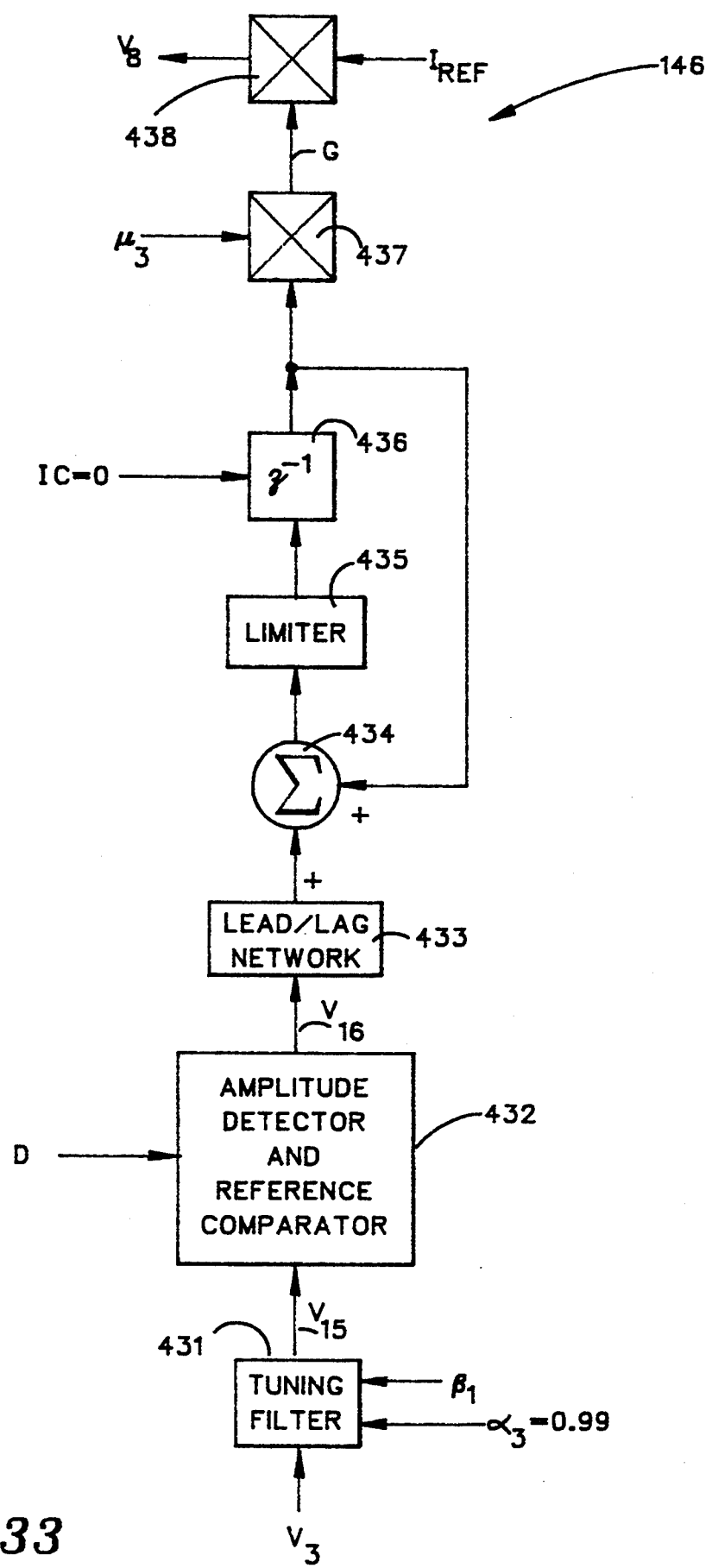
FIG. 33 is a block diagram of an automatic gain control used in the system of FIG. 14.

Turning now to FIG. 33, there is shown a block diagram of the automatic gain control 146 introduced in FIG. 14. As shown in FIG. 33, the automatic gain control 146 has a tuning filter 431 receiving the signal $v_3$, the passband center-frequency parameter $\beta_1$ from the oscillator controller 145 of FIG. 25, and a fixed passband-width parameter of $\alpha_3 = 0.99$. The tuning filter 431 has a construction as shown in FIG. 22. Therefore the tuning filter 431 has a narrow bandwidth around the reference frequency, producing a substantially noise-free reference signal $v_{15}$ having an amplitude that is to be adjusted to a predetermined desired value D. This desired value could be adjusted to compensate for variations in the shunt capacitance $C_o$; for example, when the drive fork is excited at $\omega = 1/(LC)^{\frac{1}{2}}$, the desired value D could be adjusted to $K(1+(\omega RC)^2)^{\frac{1}{2}}$, where K is a predetermined constant.

To produce an amplitude error signal $v_{16}$, an amplitude detector and reference comparator 432 receives the reference signal $v_{15}$ and the desired value D. The amplitude detector and reference comparator 432 will be further described below with reference to FIG. 34. For enhanced stability, the amplitude error signal $v_{16}$ passes through a lead/lag network 433, and then is integrated in an accumulator including an adder 434, a limiter 435, and a delay unit or register 436. The lead/lag network 433 has the construction as shown in FIG. 28. The limiter 435 has a lower limit of zero and an upper limit of 1, so that the output of the delay unit 436 is always positive. The delay unit 436 is initially set to zero. A scaling unit 437 scales the output of the delay unit 436 by a constant $\mu_3$ setting the open loop gain of the automatic gain control loop. The output of the scaling unit 437 is a gain factor G to a multiplier 438 to control the amplitude of the fork drive signal ($v_d$ in FIG. 14).

Figure 34:
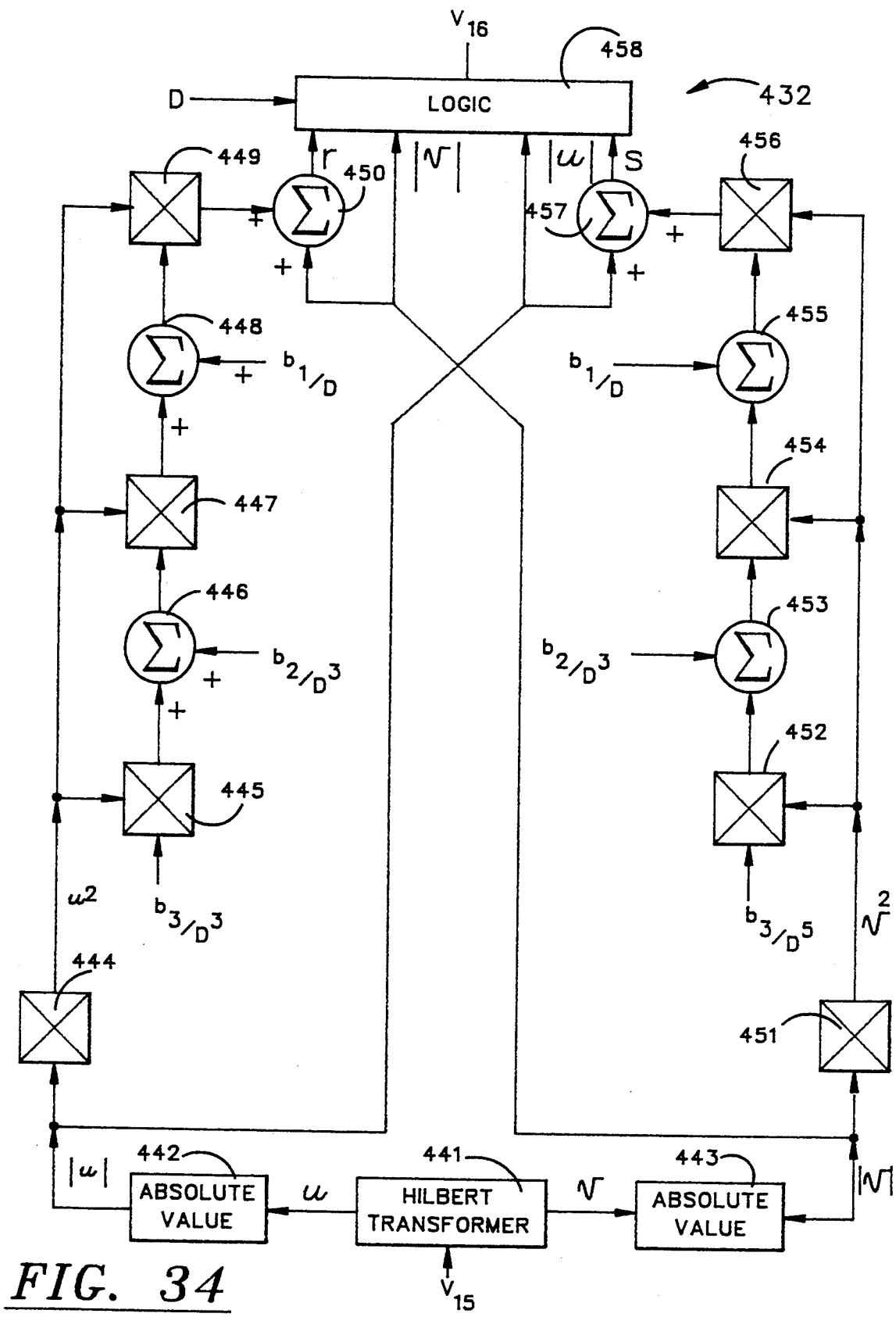
FIG. 34 is a schematic diagram of an amplitude detector and reference comparator used in the automatic gain control of FIG. 33.

Turning now to FIG. 34, there is shown a schematic diagram of the amplitude detector and reference comparator 432. This circuit is designed to perform a certain method of approximating the amplitude of a sampled sinusoidal signal. The signal $v_{15}$ is assumed to be sinusoidal such that:

$$v_{15} = A\cos(\omega nT)$$

For a value (u) of the signal $v_{15}$, there is obtained a corresponding value (v) of a quadrature phase signal $A\sin(\omega nT)$. Then:

$$u^2 + v^2 = A^2(\cos^2\omega t + \sin^2\omega) = A^2$$

Therefore, the amplitude $A = (u^2 + v^2)^{\frac{1}{2}}$. The circuit in FIG. 34 performs a certain approximation for the square root of the sum of the squares of (u) and (v) that is particularly accurate when either u or v has a magnitude that is relatively small compared to the amplitude A. Assume for a moment that (u) and (v) are both positive, and consider the function (f) defined as:

$$f(\sin\theta) = 1 - \cos\theta$$

Then v can be defined as a function of $\theta$ as:

$$v = A(1 - f(\sin\theta))$$

Now, approximating $f(\sin\theta)$ as a power series in terms of $\sin\theta$ gives:

$$f(\sin\theta) = b_1(\sin\theta)^2 + b^2(\sin\theta)^4 + b^3(\sin\theta)^6 + \ldots$$

$$f(\sin\theta) = b_1(u/A)^2 + b_2(u/A)^4 + b_3(u/A)^6 + \ldots$$

So that:

$$A = v + Af(\sin\theta) = v + b_1 u^2/A + b_2 u^4/A^3 + b_3 u^6/A^5 + \ldots$$

Now, if (u) is much less than (v), then the higher-order terms of the above equation are very small, and A can be computed iteratively. Conversely, if (v) is much less than (u), then A can be approximated by adding (u) to a power series of (v):

$$A = u + b_1 v^2/A + b_2 v^4/A^3 + b_3 v^6/A^5 + \ldots$$

In either case, the automatic gain control loop can obtain an iterative solution by estimating the error in the iterative solution, and driving the loop to reduce the estimated error to zero. The actual error E between the actual amplitude A and the desired amplitude D is:

$$E = A - D = -D + v + b_1 u^2/A + b_2 u^4/A^3 + b_3 u^6/A^5 + \ldots$$

But the automatic gain control loop will converge to $E = 0$ when it is driven with an estimated error E' such that:

$$E' = -D + v + b_1 u^2/D + b_2 u^4/D^3 + b_3 u^6/D^5 + \ldots$$

because E and E' always have the same sign. For example, when E is greater than zero, A is greater than D, so E' will be greater than zero and greater than D. When E is less than zero, A is less than D, so E' will be less than zero and less than E.

As shown in FIG. 34, a Hilbert transformer 441 produces an in-phase value (u) and a quadrature-phase value (v) from the input signal $v_{15}$. The value (u) is therefore the input signal delayed by the inherent delay in the Hilbert transformer. When the input signal $v_{15}$ is a sinusoid, the values (u) and (v) are related to the amplitude A of the sinusoid according to $A^2 = u^2 + v^2$. An absolute value unit 442 produces the magnitude $|u|$ of the inphase value (u), and an absolute value unit 443 produces the magnitude $|v|$ of the quadrature-phase value (v).

The circuit 432 in FIG. 34 determines an amplitude error estimate signal $v_{16}$ for a predetermined desired value D from the magnitudes $|u|$ and $|v|$. A fairly accurate estimate of the amplitude error is obtained so long as the magnitude of one of (u) or (v) is approximately equal to the desired value D and the magnitude of the other one of (u) or (v) is a small fraction of the desired value D. In any event, it is always possible to determine an estimate of the amplitude error that is in the proper direction for increasing or decreasing the gain factor G of the automatic gain control loop.

A multiplier 444 computes $u^2$, which is used by a multiplier 445, and adder 446, a multiplier 447, an adder 448, a multiplier 449, and an adder 450, to compute the series approximation:

$$r = |v| + b_1 u^2/D + b_2 u^4/D^3 + b_3 u^6/D^5$$

In a similar fashion, a multiplier 451 computes $v^2$, which is used by a multiplier 452, and adder 453, a multiplier 454, an adder 455, a multiplier 456, and an adder 457, to compute the series approximation:

$$s = |u| + b_1 v^2/D + b_2 v^4/D^3 + b_e v^6/D^5$$

Logic 458 receives the signals (r), (s), $|u|$, and $|v|$, and the desired value D, and produces the signal $v_{16}$ estimating the amplitude error between the amplitude of the input signal $v_{15}$ and the desired value D. The logic 458 compares $|u|$ and $|v|$ to a reference level $R = \delta D$, where $\delta$ is a predetermined fraction. The preferred value of $\delta$ is $\sin(15°) = 0.2588$. The logic 458 implements the following functions:

IF $|u| < R$ .AND. $|v| < R$, THEN $v_{16} \leftarrow D$

IF $|u| > R$ .AND. $|v| > R$, THEN $v_{16} \leftarrow 0$

IF $|u| < R$ .AND. $|v| < R$, THEN $v_{16} \leftarrow D = r$

IF $|u| > R$ .AND. $|v| > R$, THEN $v_{16} \leftarrow D = s$

The constants $b_1$, $b_2$, and $b_3$ in the power series are determined for a Chebychev approximation over the range of u or v from 0 to $\delta$. For $\delta = \sin(15°)$, the preferred values for the constants are:

$b_1$ = 0.800021 hexadecimal
$b_2$ = 0.1FF3A1 hexadecimal
$b_3$ = 0.114C3F hexadecimal A performance evaluation of the amplitude detector and reference comparator circuit of FIG. 34 is given in Appendix III below.

Figure 35:
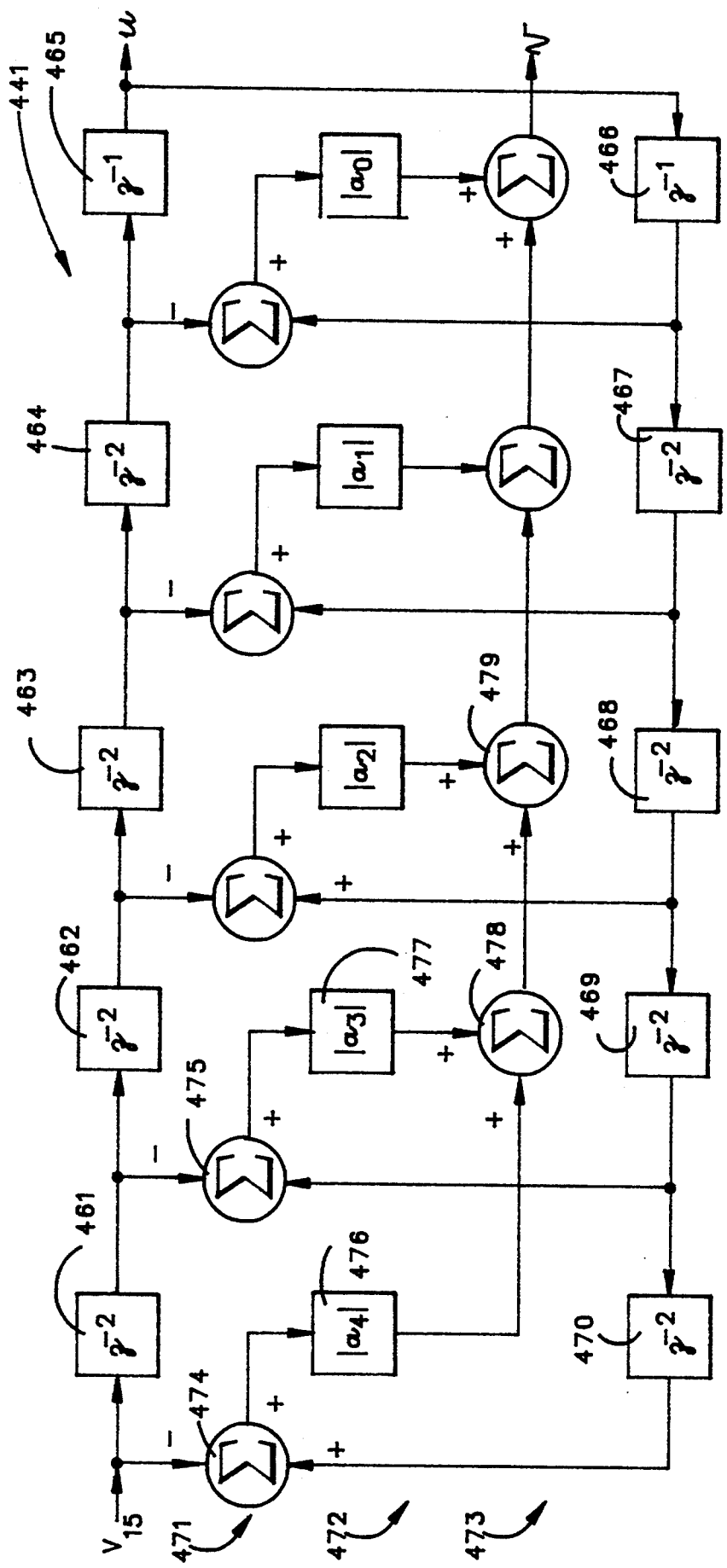
FIG. 35 is a schematic diagram of a Hilbert transformer used in the amplitude detector and reference comparator of FIG. 35.

Turning now to FIG. 35, there is shown a schematic diagram of the Hilbert transformer 441. The input signal $v_{15}$ is successively delayed by either two sample periods T or one sample period T by delay units 461–470. The delay units 461–464 and 467–470 each provide a delay of two sampling periods T, and the delay units 475,476 provide a delay of one sampling period T. The in-phase output (u) is produced by the output of the delay unit 465. The quadrature-phase output (v) is a weighted sum of the input signal $v_{15}$ and the outputs of the delay units. In particular, a first row of subtractors 471 subtracts a respective one of the input signal $v_4$ or the outputs of one of the delay units 461–464 from a respective one of the delay units 470–466. The differences are scaled by respective coefficients $a_0$–$a_4$ in a row of scaling units 472. The outputs of the scaling units 472 are summed together by a row of adders 473 to produce the quadrature-phase output (v).

As derived in Appendix IV below, an appropriate set of coefficients for the Hilbert transformer 441 are as follows:

$a_0$ = 0.6142410357
$a_1$ = 0.1529612327
$a_2$ = 0.0496214228
$a_3$ = 0.0127215311
$a_4$ = 0.0018368168

It should be noted that the Hilbert transformer 441 could be modified to increase or decrease the precision of the quadrature-phase output (v) with a corresponding increase or decrease in computational complexity. For example, the delay units 461, 462, 469, and 470, their associated subtractors 474, 475, their associated multipliers 476, 477, and their associated adders 478 and 479 could be eliminated, in which case the input signal would feed directly to the delay unit 463. In this case, the Hilbert transformer would use only three multipliers, and the coefficients $a_0$, $a_1$, and $a_2$ would be changed to:

$a_0'$ = 0.5868816329
$a_1'$ = 0.099083914
$a_2'$ = 0.0122024482

In view of the above, there has been disclosed a method and apparatus for continuously exciting a piezoelectric resonator at approximately its resonant frequency, and at two other frequencies, for measuring the shunt capacitance $C_o$, the series resistance R, the series inductance L, and the series capacitance C of an equivalent circuit model of the resonator. A set of complex demodulators determines a complex response $A_i + jB_i$ at each of the three different frequencies. The values of the circuit parameters are computed by solving simultaneously the equations that result by setting the complex response equal to the admittance of the equivalent circuit model at each of the three different frequencies. In this fashion, the equivalent circuit parameters are measured periodically during continuous operation of an oscillator for correction or compensation of the amplitude and/or frequency of oscillation.

APPENDIX I

MATHCAD (Trademark) PROGRAM
A PARAMETER ESTIMATOR
QRSESTPMTR.MCD

FIRST WE WRITE DOWN THE PARAMETER VALUES $R := 300 \cdot 10^3$
$L := 23.8 \cdot 10^3$  
$C := 10.6 \cdot 10^{-15}$
$C_o := 5 \cdot 10^{-12}$ The equivalent circuit of the fork is R, L, and C in series This is the shunt capacitance.

NEXT WE SET UP SOME BASICS $j := \sqrt{-1}$

We have to define this ...

$I := 3$

The number of excitation frequencies.

$i := 0 \ldots I - 1$

The excitation-frequency index.

$1_i := 1$

A unit weighting vector $f_o := [2\pi \cdot \sqrt{L \cdot C}]^{-1}$

The frequency of oscillation of the fox.

$f_s := 100$

Excitation-frequency spacing in Hz.

$f_i := f_o + f_s \cdot (i - 1)$

The excitation frequencies in Hz.

$\omega := 2 \cdot \pi \cdot f$

The excitation frequencies in rad/sec.

$s := j \cdot \omega$

The Laplace variable in steady state.

$\eta := 0.01$

Additive uniformly-distributed computational noise.

$SNR := -10 \cdot \log\left[\frac{\eta^2}{12}\right]$ $SNR = 51$ dB $K_\eta := 1 + rnd(\eta)$ This is where we add some noise to the measurements.

$G := K_\eta \cdot \left[ s \cdot C_o + \frac{s \cdot C}{L \cdot C \cdot s^2 + R \cdot C \cdot s + 1} \right]$ This is the transfer function whose parameters we are going to estimate.

HERE'S HOW WE DO THE COMPUTATIONS

We pull out the real and imaginary components of the transfer function (A and B, respectively), and then we construct the 3 × 3 matrix, M, whose closed-form inverse we can easily write out, if we choose:

$A := Re(G)$ $B := Im(G)$
$M_{i,0} := A_i \cdot \omega_i \quad M_{i,1} := B_i \cdot \omega_i$
$M_{i,2} := -\omega_i^2$ $P := M^{-1} \cdot A$ Solve for the parameter vector whose elements are $LC: p_0 \quad RC := P_1$ and $RCC_o := P_2$ Now we can estimate the actual parameter values:

$$C_{oest} := \frac{P_2}{P_1} \quad C_{est} := \left[ B\left[\frac{1}{\omega} - \omega \cdot p_0\right] + A \cdot p_1 + \frac{P_2}{P_1} \cdot [\omega^2 \cdot p_0 - 1] \right] \cdot \frac{1}{I}$$

$$L_{est} := \frac{p_0}{C_{est}} \quad R_{est} := \frac{P_1}{C_{est}}$$

FINALLY, WE DO A SHOW-AND-TELL WITH THE RESULTS

Compare
$R = 3 \cdot 10^5$
$L = 2.38 \cdot 10^4$
$C = 5 \cdot 10^{-12}$
$C_o = 5 \cdot 10^{-12}$
Pretty good!

$SNR = 51$ dB
$R_{est} = 2.999962205874033 \cdot 10^5$
$L_{est} = 2.379970016660071 \cdot 10^4$
$C_{est} = 1.060013354092741 \cdot 10^{-14}$
$C_{oest} = 5.000062991003502 \cdot 10^{-12}$

END OF PROGRAM

APPENDIX II

MATHCAD (Trademark) PROGRAM
TRACKING FILTER DESIGN
QRSTRACK

INPUTS $f_s := 2^{15}$ $f_s = 3.277 \cdot 10^4$ — The sampling frequency in Hz.

$f_h := 500$ — The 3 dB-passband width of the filter in Hz.

$f_o := 10000$ — Tuning frequency of the filter. The axtual adjustment is via parameter B.

$N := 1$ — Number of cascaded stages of filtering.

SETUP $T := f_s^{-1}$ — Sampling period: $T = 3.052 \cdot 10^{-5}$ $\alpha := \dfrac{1 - \tan[0.5 \cdot \pi \cdot f_h \cdot T]}{1 + \tan[[0.5 \cdot \pi 9 \cdot f_h \cdot T]]}$ — The passband-width parameter: $\alpha = 0.953$ $\beta := -\cos[2 \cdot \pi \cdot f_o \cdot T]$ — The tuning parameter: $\beta = 0.34$ $K := 100$ $k := 0 \ldots K - 1$ — The number of frequency-analysis points used in performance evaluation and the frequency-analysis index.

$f_k := \dfrac{f_s}{2} \cdot \dfrac{k+1}{K}$ — The analysis frequencies.

$z := \overline{\exp(2j \cdot \pi \cdot f \cdot T)}$ — The discrete-time variable in steady state.

$G := \overline{\left[ \dfrac{z^{-2} + \beta \cdot (1 + \alpha) \cdot z^{-1} + \alpha}{1 + \beta \cdot (1 + \alpha) \cdot z^{-1} + \alpha \cdot z^{-2}} \right]}$ — The simplest second-order all-pass filter realizable by a Gray-Markel lattice structure.

$H := \overline{\left[ \left[ \dfrac{1}{2} \cdot (1 - G) \right]^N \right]}$ — A simple 2nd-order bandpass filter with unity passband gain, single-parameter tuning, single parameter passband-width adjustment, and minimum coefficient sensitivity.

$HdB := 20 \cdot \overline{\log(H)}$ — Filter amplitude-frequency response expressed in dB.

APPENDIX III

MATHCAD (Trademark) PROGRAM
AMPLITUDE-CORRECTOR COEFFICIENTS FOR
PEAK-PICKING AGC
(A minimum mean-squared-error approach)
QRSMSEPPAGC $B := 24$ — Number of bits in each coefficient.

$N := 3$ — Number of coefficients.

$n := 0 \ldots N - 1$ — Coefficient index.

$K := 100$ — Number of values used in curve fitting.

$k := 0 \ldots K - 1$ — Curve-fitting index.

$\theta_{min} := 0$ — Minimum value of independent variable.

$\theta_{max} := \left[\dfrac{\pi}{180}\right] \cdot 15$ — Maximum value of independent variable.

$\theta_k := \left[\theta_{min} + [\theta_{max} - \theta_{min}] \cdot \dfrac{k}{K-1}\right]$ — Values of the independent variable used in curve fitting.

$r := 1 - \overline{\cos(\theta)}$ — The function to which we are trying to do the fit.

$x := \overline{[\sin(\theta)^2]}$ — The function with which we are doing the fitting.

$X_{k,n} = x_n^{n+1}$ — The independent-variable matrix.

APPENDIX III-continued

MATHCAD (Trademark) PROGRAM
AMPLITUDE-CORRECTOR COEFFICIENTS FOR
PEAK-PICKING AGC
(A minimum mean-squared-error approach)
QRSMSEPPAGC $a := (X^T \cdot X)^{-1} \cdot X^T \cdot r$ — The coefficients obtained by the unconstrained solution.

$COEF := \overline{floor[0.5 + 2^B \cdot a]}$ — The coefficients rounded to 24-bit numbers.

$b := 2^{-B} \cdot COEF$ — The 24-bit coefficients expressed as decimal numbers.

$R := X \cdot b$ — The actual fit obtained by using the 24-bit coefficients.

$e := r - R$ — The error between the original function, r, and the 3-term approximation using the 24-bit coefficients.

$b: \begin{bmatrix} 0.500001967 \\ 0.1248112321 \\ 0.0675696731 \end{bmatrix}$ — The decimal-valued coefficients rounded to 24-bits.

$COEF = \begin{bmatrix} 800021h \\ 1ff3a1h \\ 114c3fh \end{bmatrix}$ — The hex-valued coefficients rounded to 24 bits.

APPENDIX III-continued
**MATHCAD (Trademark) PROGRAM
AMPLITUDE-CORRECTOR COEFFICIENTS FOR
PEAK-PICKING AGC
(A minimum mean-squared-error approach)
QRSMSEPPAGC**

$$\text{floor}\left[\frac{-\log[\max(\overline{|e|})]}{\log(2)}\right] = 25$$

The accuracy of our solution expressed in bits.

END OF PROGRAM

APPENDIX IV

**MATHCAD (Trademark) PROGRAM
OPTIMUM HILBERT TRANSFORMER DESIGN PROGRAM
QRSHILBERT.MCD**

INITIALIZE $f_s := 2^{15}$ — Sampling frequency $f_{min} := 8000$ — Minimum Hilbert transformer passband edge $f_{max} := 12000$ — Maximum Hilbert transformer passband edge $f_0 := f_{max} - \frac{f_s}{4} \quad f_1 := \frac{f_s}{4} - f_{min}$ — Frequency vector components $R := \frac{f_s}{\max(f)} \quad R = 8.605$ — Ratio of sampling frequency to passband-edge frequency of the baseband filter $B := 30$ — Number of bits to use in coefficient values $A_{pb} := -90$ — Passband peak ripple spec in dB $N := \text{floor}\left[R \cdot \frac{A_{pb} + 13}{29.2 \cdot (4 - R)} + \frac{1}{4}\right]$ — Calculation of number of multiplier coefficient required to meet the ripple spec.

$m := 0 \ldots N \quad \text{ZERO}_m := 0$ — $N = 5$
WRITEPRN(FB): = ZERO □ — PRINTCOLWIDTH: = 10
WRITEPRN(FA): = ZERO □ — PRNPRECISION: = 10
WRITE(COUNT): = 0 □ Type "PROCESS", comment FA, FB, & COUNT, then GOTO 165.

SETUP

ITERATION: = READ(COUNT) ITERATION = 3 — PBE: = $(R)^{-1}$
WRITE(COUNT): = 1 + ITERATION — PBE = passband edge
ITERATION: = READ(COUNT) ITERATION = 4 — PBE = 0.1162109375
$n := 0 \ldots N$ — n and r are indices. "N" is reserved for computing the filter performance error or ripple; index values 0 through N − 1 are for the actual multiplier-coefficient indices. The multiplier-coefficient index is q.

$q := 0 \ldots N - 1$

FA: = READPRN(FA) — Measured passband extremal frequencies

FB: = READPRN(FB) — Measured stopband extremal frequencies $\text{FPB}_m := \text{if}\left[\text{ITERATION} \approx 1, \text{PBE} \cdot \frac{m}{N}, \text{FA}_m\right]$ — Passband extremal frequencies used in calculations $\text{FSB}_m := \text{if}\left[\text{ITERATION} \approx 1, \frac{1}{2} - \left[1 - \frac{m}{N}\right] \cdot \text{PBE}, \text{FB}_m\right]$ — Stopband extremal frequencies used in calculations.

$M_{m,n} := \text{if } [n \approx N, 2 \cdot (-1)^m, 4 \cdot \cos[(2 \cdot n + 1) \cdot 2 \cdot \pi \cdot \text{FPB}_m]]$ — Remez matrix
$r_m := 1$ — The all-unit vector.
$\alpha := M^{-1} \cdot r$ — The coefficient and error vector.

$\delta := \alpha_N$ — The error measure
$a_q := 2^{-B} \cdot [\text{floor}[.5 + 2^{B+1} \cdot \alpha_q]]$ — Filter coefficients doubled and rounded to B bits.

$K := 256$ — Number of points for frequency analysis
$k := 0 \ldots K - 1$ — Frequency-response evaluation index.

$\text{FFPB}_k := \text{PBE} \cdot \frac{k}{K - 1}$ — Frequency variable for pass-band-performance evaluation.

$\text{FFSB} := \frac{1}{2} - \text{FFPB}$ — Frequency variables for stop-band-performance evaluation.

$\text{FG} := \frac{1}{2} \cdot \frac{\text{FFPB}}{\text{PBE}}$ — Frequency variable for total filter evaluation.

APPENDIX IV-continued

MATHCAD (Trademark) PROGRAM
OPTIMUM HILBERT TRANSFORMER DESIGN PROGRAM
QRSHILBERT.MCD

PASSBAND PERFORMANCE EVALUATION

The exact expression for the passband error is:

$$EPB := 1 - \frac{1}{2} \cdot \overline{\left[1 + \sum_q 2 \cdot a_q \cdot \cos((2 \cdot q + 1) \cdot 2 \cdot \pi \cdot FFPB)\right]}$$

$EPB_K := EPB_{K-1}$ — Define an artificial end point to make the notation work.

$XPB_{k+1} := \text{if}[EPB_{k+1} < EPB_k, \delta, -\delta]$ — Filter performance and passband extremal-frequency marker.

Now we can estimate the passband extremal frequencies:
$PB_{k+1} := \text{if}[XPB_{k+1} \approx -XPB_k, FFPB_k, PBE]$
$SPB_m := (\text{sort}(PB))_m$ — Extract $N + 1$ passband extremal-frequency estimates.

$WRITEPRN(FA) := SPB$ — This puts estimated passband extremal frequencies into memory.

$PBRIPPLE := 20 \cdot \log[\overline{\max[(|EPB|)]}]$ — Computation of the peak passband ripple dB.

STOPBAND PERFORMANCE EVALUATION

The exact expression for the stopband error is:

$$ESB := 0 - \frac{1}{2} \cdot \overline{\left[1 + \sum_q 2 \cdot a_q \cdot \cos((2 \cdot q + 1) \cdot 2 \cdot \pi \cdot FFSB)\right]}$$

$ESB_K := ESB_{K-1}$ — Define an artificial end point to make the notation work.

$XSB_{k+1} := \text{if}[ESB_{k+1} < ESB_k, -\delta, \delta]$ — Filter performance and stopband extremal-frequency marker.

Now we can estimate the stopband extremal frequencies:

$$SB_{k+1} := \text{if}\left[XSB_{k+1} \approx -XSB_k, FFSB_k, \frac{1}{2} - PBE\right] \quad SB_K := \frac{1}{2}$$

$SORTSB_m := (-\text{sort}(-SB))_m$
$SSB := \text{sort}(SORTSB)$ — Extract $N + 1$ stopband extremal-frequency estimates and sort them in ascending order.
$WRITEPRN(FB) := SSB$ — This puts the estimated stopband extremal frequencies into memory.

$SBRIPPLE := 20 \cdot \log[\overline{\max[(|ESB|)]}]$ — Compute the peak stopband ripple in dB.

PROTOTYPE FILTER PERFORMANCE SUMMARY

The cascaded half-band prototype filter overall frequency response is given by:

$$GPB := \frac{1}{2} \cdot \overline{\left[1 + \sum_q 2 \cdot a_q \cdot \cos((2 \cdot q + 1) \cdot 2 \cdot \pi \cdot FG)\right]}$$

Filter coefficient values:

$$a = \begin{bmatrix} 0.6142410357 \\ -0.1529612327 \\ 0.0496214228 \\ 0.0127215311 \\ 0.0018368168 \end{bmatrix}$$

ITERATION = 4  $\qquad$ N = 5
PBRITTLE = −95.6  $\qquad$ B = 30
SBRITTLE = −95.6  $\qquad$ R = 8.6050420168
SPECS: $A_{pb}$ = −90  $\qquad$ $\delta$ = −0.000016511

CONVERT THE PROTOTYPE DESIGN TO A HILBERT TRANSFORMER $FH_k := \frac{k}{K}$ — The evaluation frequencies $j := \sqrt{-1}$ — Discrete-time variable in steady state

APPENDIX IV-continued
MATHCAD (Trademark) PROGRAM
OPTIMUM HILBERT TRANSFORMER DESIGN PROGRAM
QRSHILBERT.MCD $z := \overline{\exp(j \cdot 2 \cdot \pi \cdot FH)}$ $p := 0.44 \cdot N - 2$      Hilbert-transformer-coefficient index
$i_p := p - (2 \cdot N - 1)$      A useful auxiliary vector
The Hilbert transformer coefficient values:

$$b_p := \left[ \text{if}\left[ p \approx 2 \cdot N - 1, 1, \text{if}\left[ \text{mod}(p,2) \approx 1, 0, a\left[ \frac{|i_p| - 1}{2} \right] \right] \right] \cdot \exp\left[ j \cdot i_p \cdot \frac{\pi}{2} \right] \right]$$

$G := \overline{\left[ z^{2 \cdot N - 1} \cdot \sum_p b_p \cdot z^{-p} \right]}$      The transfer function of the Hilbert transformer

EVALUATE THE PERFORMANCE OF THE HILBERT TRANSFORMER $GR := \overline{\left[ z^{2 \cdot N - 1} \cdot \sum_q \text{Re}[b_p] \cdot z^{-p} \right]}$      The real part of the Hilbert transformer $GI := \overline{\left[ z^{2 \cdot N - 1} \cdot \sum_p \text{Im}[b_p] \cdot z^{-p} \right]}$      The imaginary part of the Hilbert transformer $$b = \begin{bmatrix} -0.0018368168j \\ 0 \\ -0.0127215311j \\ 0 \\ -0.0496214228j \\ 0 \\ 0.1529612327j \\ 0 \\ 0.6142410357j \\ 1 \\ 0.6142410357j \\ 0 \\ 0.1529612327j \\ 0 \\ 0.0496214228j \\ 0 \\ 0.0127215311j \\ 0 \\ 0.0018368168j \end{bmatrix}$$

END OF PROGRAM

What is claimed is:

1. A method of measuring a shunt capacitance of a piezoelectric resonator, comprising the steps of:
    (a) exciting said piezoelectric resonator at a plurality of frequencies, one of which is approximately a resonant frequency of said piezoelectric resonator;
    (b) measuring responses of said piezoelectric resonator at said frequencies, one of which said measurings is of an amplitude of resonance of said piezoelectric resonator at approximately said resonant frequency of said piezoelectric resonator; and
    (c) determining a value of said shunt capacitance from said responses at said frequencies;

wherein at least one of said responses is a complex response, and wherein said amplitude of resonance is measured by exciting said piezoelectric resonator at a level of excitation adjusted by gain of an automatic gain control to obtain a response having an amplitude approximately equal to a reference level, whereby said amplitude of resonance is indicated by said gain of said automatic gain control and wherein said complex response is measured by complex demodulation of a signal from said piezoelectric resonator, each said complex demodulation being accomplished by modulating said signal from said piezoelectric resonator by a first demodulationreference signal to produce an in-phase demodulated component and by modulating said signal from said piezoelectric resonator by a second demodulation-reference signal to produce a quadrature-phase demodulated component, the second demodulation reference signal being the first demodulation-reference signal phase shifted by ninety degrees.

2. A method of measuring a shunt capacitance of a piezoelectric resonator, comprising the steps of:
    (a) exciting said piezoelectric resonator at a plurality of frequencies; measuring responses of said piezoelectric resonator at said frequencies;
    (b) measuring responses of said piezoelectric resonator at said frequencies; and
    (c) determining a value of said shunt capacitance from said responses at said frequencies;

wherein at least one of said responses is a complex response, and wherein said complex response is measured by complex demoudlation of a signal from said piezoelectric resonator, each said complex demodulation being accomplished by modulating said signal from said piezoelectric resonator by a first demodulation reference signal to produce an in-phase demodulated component and by modulating said signal from said piezoelectric resonator by a second demodulation-reference signal to produce a quadrature-phase demodulated component, the second demodulation reference signal being the first demodulation-reference signal phase shifted by ninety degrees.

3. A method of measuring circuit parameters of a piezoelectric resonator, said method comprising the steps of:
   (a) exciting said piezoelectric resonator at each of three distinct frequencies;
   (b) measuring a complex response of said piezoelectric resonator to each of said three distinct frequencies; and
   (c) computing values of said circuit parameters from the measured complex responses of said piezoelectric resonator to said three distinct frequencies, wherein said complex response at each of said three distinct frequencies is measured by complex demodulation of a signal from said piezoelectric resonator with an in-phase reference signal and a quadrature-phase reference signal at each of said three frequencies, each said complex demodulation being accomplished by modulating said signal from said piezoelectric resonator by a first demodulationreference signal to produce an in-phase demodulated component and by modulating said signal from said piezoelectric resonator by a second demodulation-reference signal to produce a quadrature-phase demodulated component, the second demodulation reference signal being the first demodulation-reference signal phase shifted by ninety degrees.

4. A method of measuring circuit parameters of a piezoelectric resonator, said method comprising the steps
   (a) exciting said piezoelectric resonator at each of three distinct frequencies;
   (b) measuring a complex response of said piezoelectric resonator to each of said three distinct frequencies; and
   (c) computing values of said circuit parameters from the measured complex responses of said piezoelectric resonator to said three distinct frequencies and wherein said complex response is measured by complex demodulation of a signal from said piezoelectric resonator, each said complex demodulation being accomplished by modulating said signal from said piezoelectric resonator by a first demodulation-reference signal to produce an in-phase demodulated component and by modulating said signal from said piezoelectric resonator by a second demodulation-reference signal to produce a quadrature-phase demodulated component, the second demodulation reference signal being the first demodulation-reference signal phase shifted by ninety degrees, wherein said circuit parameters include a shunt capacitance ($C_o$), a series resistance (R), a series inductance (L), and a series capacitance (C), and wherein said step of computing said circuit parameters includes computing values for the shunt capacitance ($C_0$) and series resistance (R) by solving simultaneously the following equations for the three different frequencies ($\omega_i$ for i=0, 1, and 2) and the complex responses $A_i + jB_i$:

$$a_i = A_i\omega_i^2 LC - B_i\omega_i RC - \omega_i RCC_0 = 0$$

$$A_i\omega_i RC + B_i = B_i 107\ i^2 LC - \omega_i C - \omega_i C_0 + \omega_i{}^3 LCC_0 = 0.$$

5. An apparatus for measuring circuit parameters of a piezoelectric resonator, said apparatus comprising:
   (a) means for exciting said piezoelectric resonator at each of three distinct frequencies, said means for exciting including means for producing an in-phase reference signal and a quadrature-phase reference signal at each of said three distinct frequencies;
   (b) a complex demodulator for each of said three distinct frequencies, each of said complex demodulators being coupled to said piezoelectric resonator and said means for exciting for demodulating a signal from said piezoelectric resonator with said in-phase reference signal and said quadrature-phase reference signal at said each of said three distinct frequencies to produce an in-phase demodulated signal and a quadrature-phase demodulated signal at said each of said three distinct frequencies, each said complex demodulator including means for modulating said signal from said piezoelectric resonator by a first demodulation-reference signal to produce an in-phase demodulated component and means for modulating said signal from said piezoelectric resonator by a second demodulation-reference signal to produce a quadrature-phase demodulated component, the second demodulation reference signal being the first demodulation-reference signal phase shifted by ninety degrees; and
   (c) means coupled to the complex demodulators for computing values of said circuit parameters from said in-phase demodulated signal and said quadrature-phase demodulated signals;

wherein said circuit parameters include a shunt capacitance ($C_0$), a series resistance (R), a series inductance (L), and a series capacitance (C), and wherein said step of computing said circuit parameters includes computing values for the shunt capacitance ($C_o$) and series resistance (R) by solving simultaneously the following equations for the three different frequencies ($\omega_i$ for i=0, 1, and 2) and the complex responses $A_i + jB_i$:

$$a_i = A_i\omega_i^2 LC - B_i\omega_i RC - \omega_i RCC_0 = 0$$

$$A_i\omega_i RC + B_i = B_i 107\ i^2 LC - \omega_i C - \omega_i C_0 + \omega_i{}^3 LCC_0 = 0.$$

* * * * *